(12) United States Patent
Kwak et al.

(10) Patent No.: US 10,199,660 B2
(45) Date of Patent: Feb. 5, 2019

(54) SHADOW MASK ALIGNMENT AND MANAGEMENT SYSTEM

(71) Applicant: Applied Materials, Inc., Santa Clara, CA (US)

(72) Inventors: Byung-Sung Leo Kwak, Portland, OR (US); Stefan Bangert, Steinau (DE); Ralf Hofmann, Soquel, CA (US); Michael Koenig, Frankfurt (DE)

(73) Assignee: Applied Materials, Inc., Santa Clara, CA (US)

(*) Notice: Subject to any disclaimer, the term of this patent is extended or adjusted under 35 U.S.C. 154(b) by 229 days.

(21) Appl. No.: 15/076,523

(22) Filed: Mar. 21, 2016

(65) Prior Publication Data

US 2016/0204451 A1 Jul. 14, 2016

Related U.S. Application Data

(62) Division of application No. 12/905,460, filed on Oct. 15, 2010, now Pat. No. 9,325,007.
(Continued)

(51) Int. Cl.
*H01M 6/40* (2006.01)
*H01M 4/13* (2010.01)
(Continued)

(52) U.S. Cl.
CPC ............. *H01M 6/40* (2013.01); *C23C 14/042* (2013.01); *H01M 4/13* (2013.01); *H01M 4/139* (2013.01);
(Continued)

(58) Field of Classification Search
CPC .................................. C23C 16/042; C23C 16/04
See application file for complete search history.

(56) References Cited

U.S. PATENT DOCUMENTS 5,352,294 A   10/1994   White et al.
7,196,775 B2   3/2007   Galburt
(Continued)

FOREIGN PATENT DOCUMENTS

CN   1861833 A   11/2006
JP   S63-42155 U   3/1988
(Continued)

OTHER PUBLICATIONS

JP2005/0259948, Eng. Mach. translation, Mar. 2004 (Year: 2004).*
(Continued)

*Primary Examiner* — Joseph A Miller, Jr.
(74) *Attorney, Agent, or Firm* — Schwabe, Williamson & Wyatt, P.C.

(57) ABSTRACT

A magnetic handling assembly for thin-film processing of a substrate, a system and method for assembling and disassembling a shadow mask to cover a top of a workpiece for exposure to a processing condition. The assembly may include a magnetic handling carrier and a shadow mask disposed over, and magnetically coupled to, the magnetic handling carrier to cover a top of a workpiece that is to be disposed between the shadow mask and the magnetic handling carrier when exposed to a processing condition. A system includes a first chamber with a first support to hold the shadow mask, a second support to hold a handling carrier, and an alignment system to align the shadow mask a workpiece to be disposed between the carrier and shadow mask. The first and second supports are moveable relative to each other.

6 Claims, 27 Drawing Sheets

Related U.S. Application Data

(60) Provisional application No. 61/255,426, filed on Oct. 27, 2009.

(51) Int. Cl.
*H01M 4/139* (2010.01)
*H01M 4/58* (2010.01)
*H01M 4/62* (2006.01)
*H01M 4/66* (2006.01)
*C23C 14/04* (2006.01)
*H01M 4/02* (2006.01)

(52) U.S. Cl.
CPC ......... *H01M 4/5825* (2013.01); *H01M 4/621* (2013.01); *H01M 4/623* (2013.01); *H01M 4/663* (2013.01); *H01M 4/02* (2013.01); *H01M 2004/028* (2013.01); *Y02E 60/122* (2013.01); *Y10T 29/49002* (2015.01); *Y10T 29/5313* (2015.01)

(56) References Cited

U.S. PATENT DOCUMENTS

| | | | |
|---|---|---|---|
| 9,325,007 B2 | 4/2016 | Kwak et al. | |
| 2005/0034810 A1 | 2/2005 | Yamazaki et al. | |
| 2005/0287897 A1* | 12/2005 | Tanaka | C23C 14/042 445/24 |
| 2006/0011136 A1 | 1/2006 | Yamazaki et al. | |
| 2006/0038973 A1 | 2/2006 | Galburt | |
| 2006/0086321 A1* | 4/2006 | Brody | C23C 14/042 118/720 |
| 2006/0150910 A1 | 7/2006 | Han et al. | |
| 2006/0289306 A1* | 12/2006 | Kim | C23C 14/50 204/298.16 |
| 2007/0006807 A1 | 1/2007 | Manz | |
| 2007/0009652 A1 | 1/2007 | Manz et al. | |
| 2008/0006523 A1 | 1/2008 | Hosokawa et al. | |
| 2009/0151630 A1 | 6/2009 | Marcanio et al. | |
| 2009/0291610 A1 | 11/2009 | Sasaki | |

FOREIGN PATENT DOCUMENTS

| | | |
|---|---|---|
| JP | H02-173257 A | 7/1990 |
| JP | H06-088206 A | 3/1994 |
| JP | H11-158605 A | 6/1999 |
| JP | 2004-079349 | 3/2004 |
| JP | 2004-176124 | 6/2004 |
| JP | 2005-248249 A | 9/2005 |
| JP | 2005-259948 | 9/2005 |
| JP | 2006-118004 A | 5/2006 |
| JP | 2006-069625 A | 6/2006 |
| JP | 2006-302897 A | 11/2006 |
| WO | WO 2005/087969 A1 | 9/2005 |
| WO | WO 2007/145402 | 12/2007 |
| WO | WO 2009/069743 A1 | 6/2009 |

OTHER PUBLICATIONS

First Office Action—Chinese Patent Application No. 201410802196.6; dated Aug. 3, 2016, 13 pages.
Office Action—Korean Patent Application No. 10-2012-7013722; dated Dec. 1, 2016, 11 pages.
International Preliminary Report on Patentability, Application No. PCT/US2010/053067 dated May 1, 2012; 5 pages.
PCT International Search Report for PCT/US2010/053067, dated Jun. 28, 2011 (3pages).

\* cited by examiner

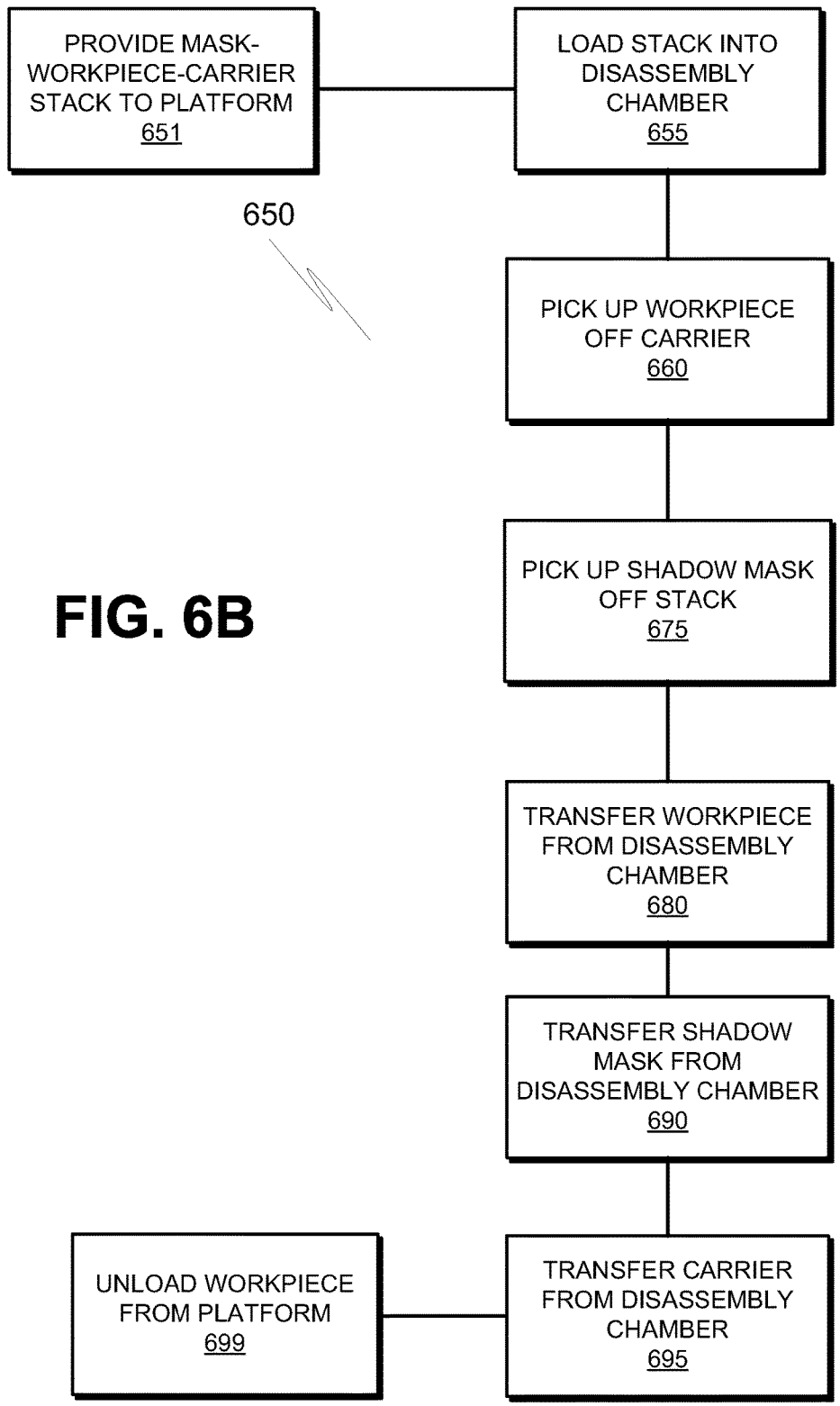

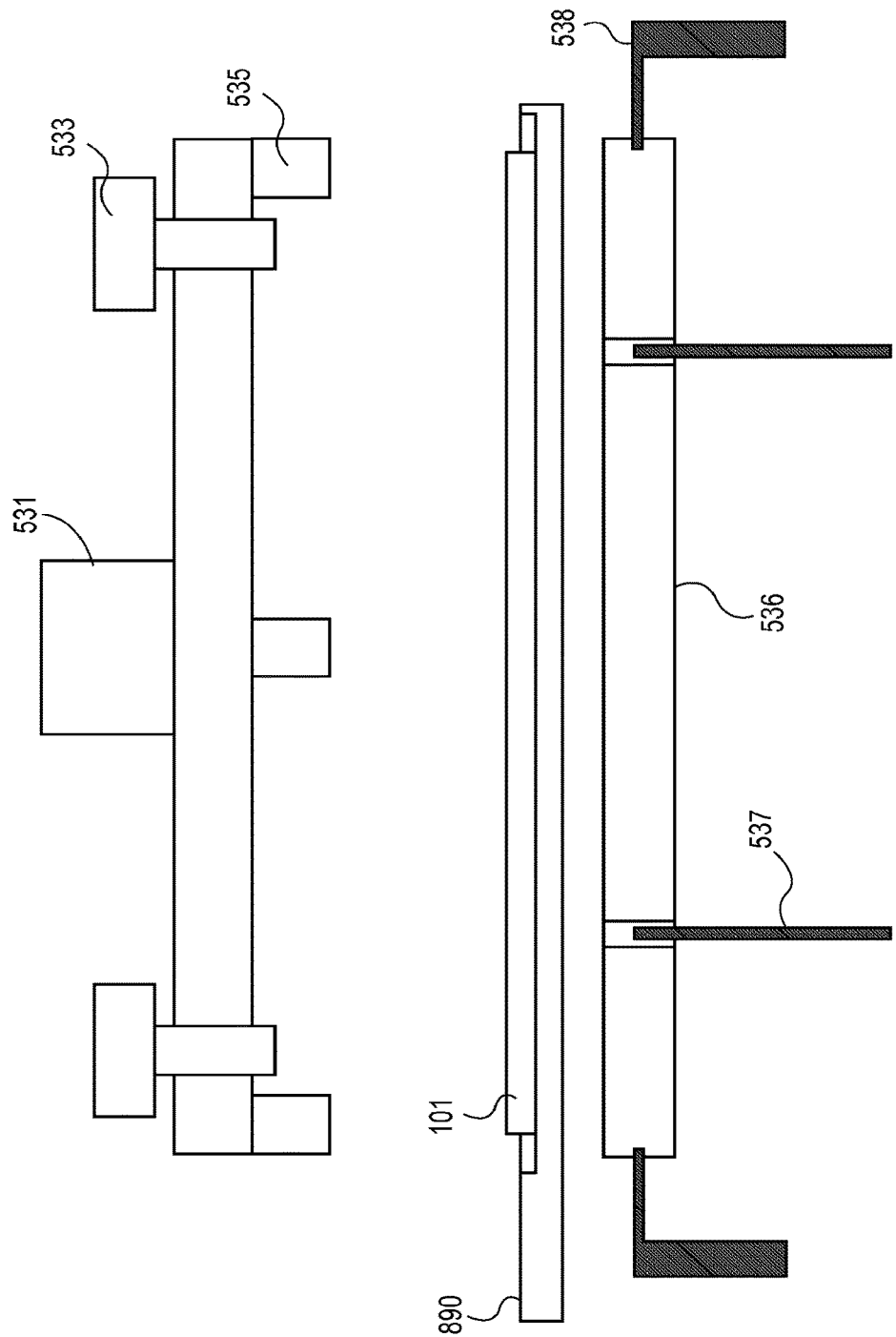

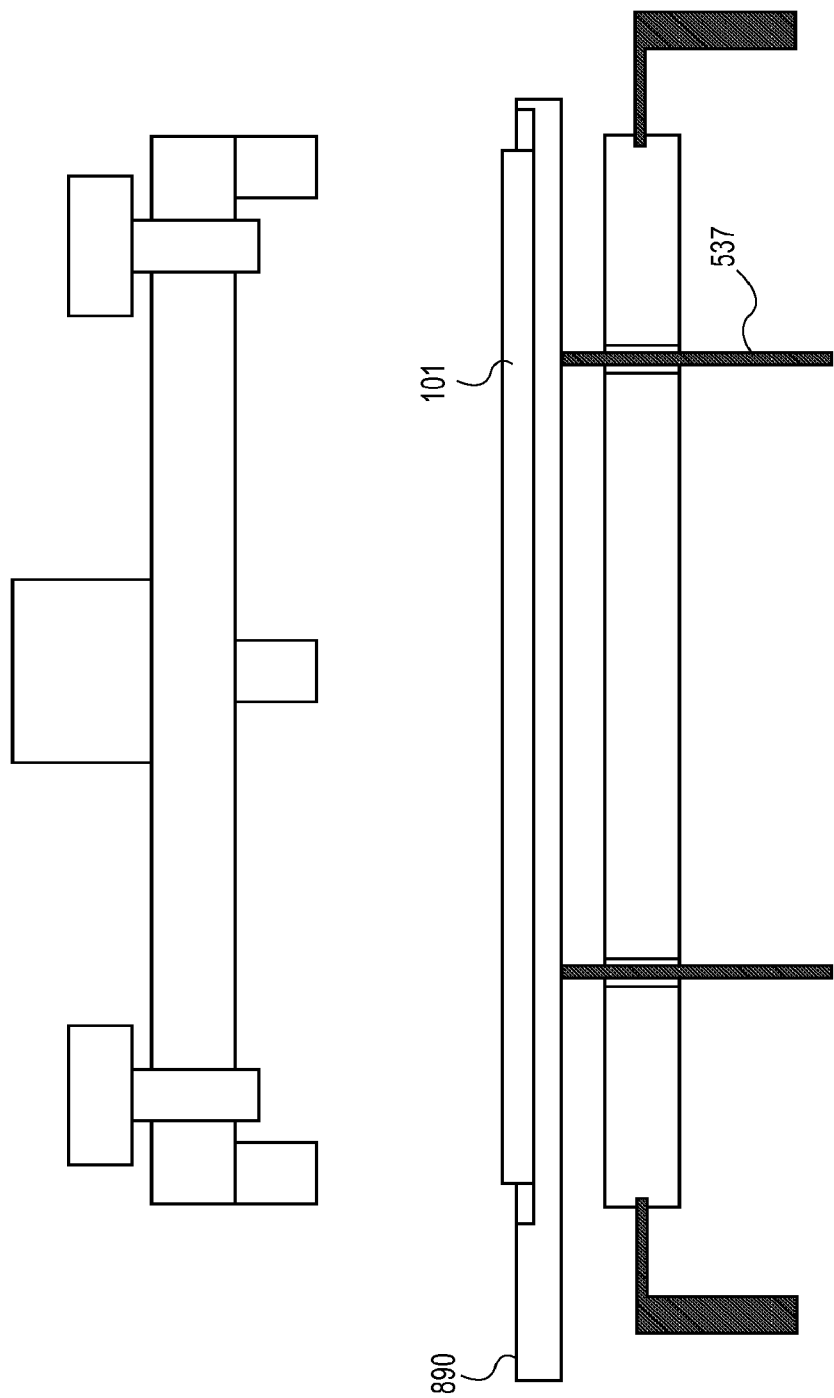

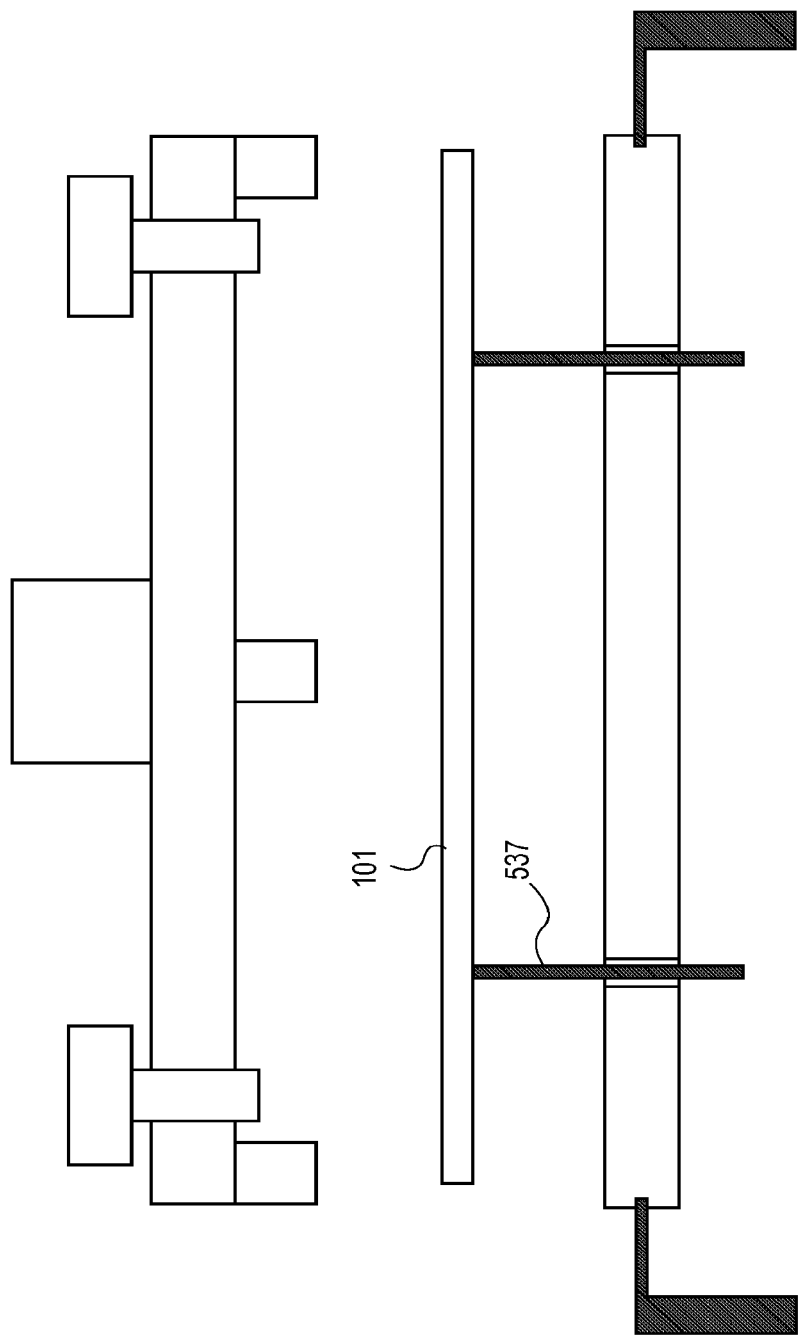

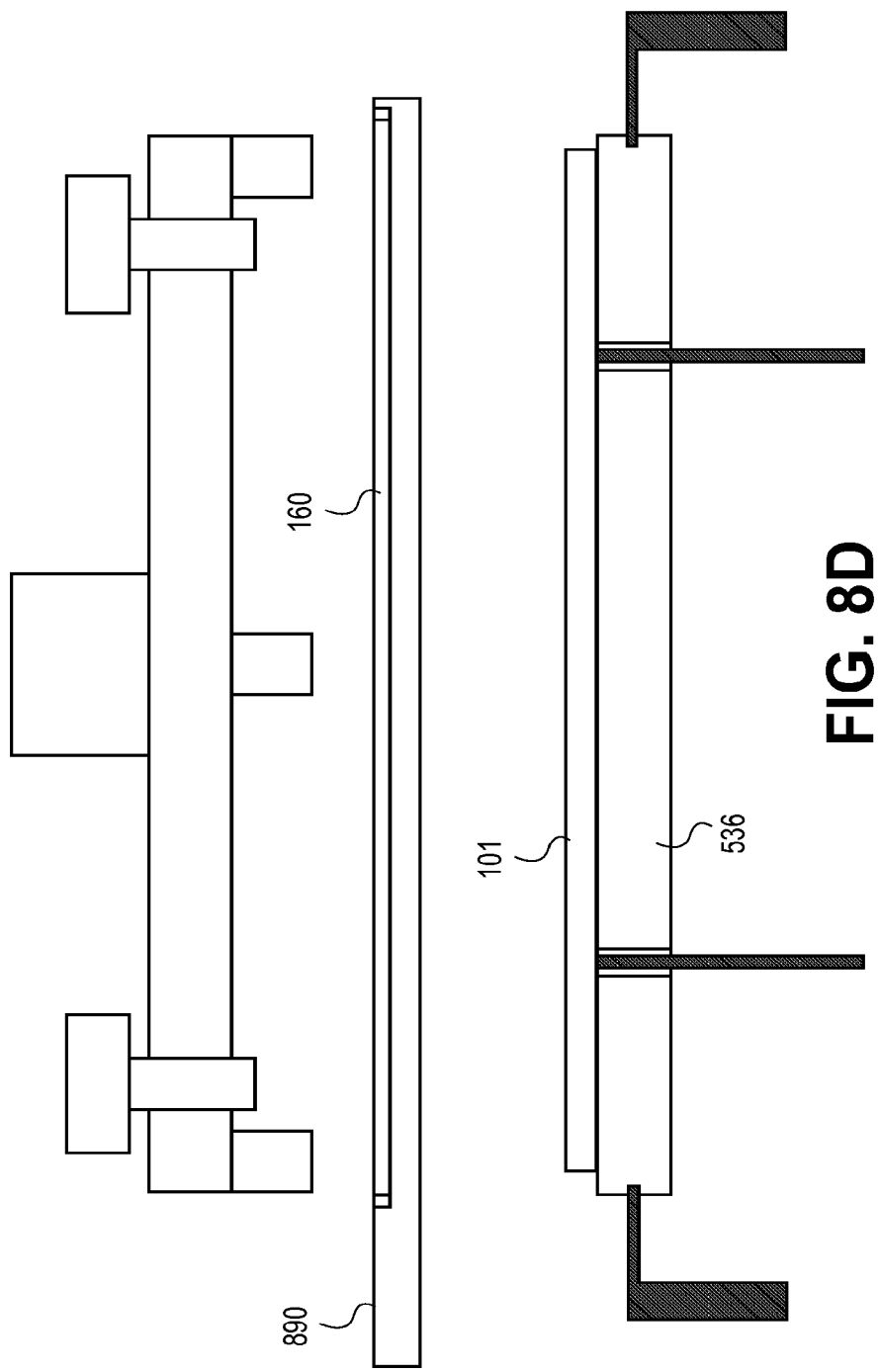

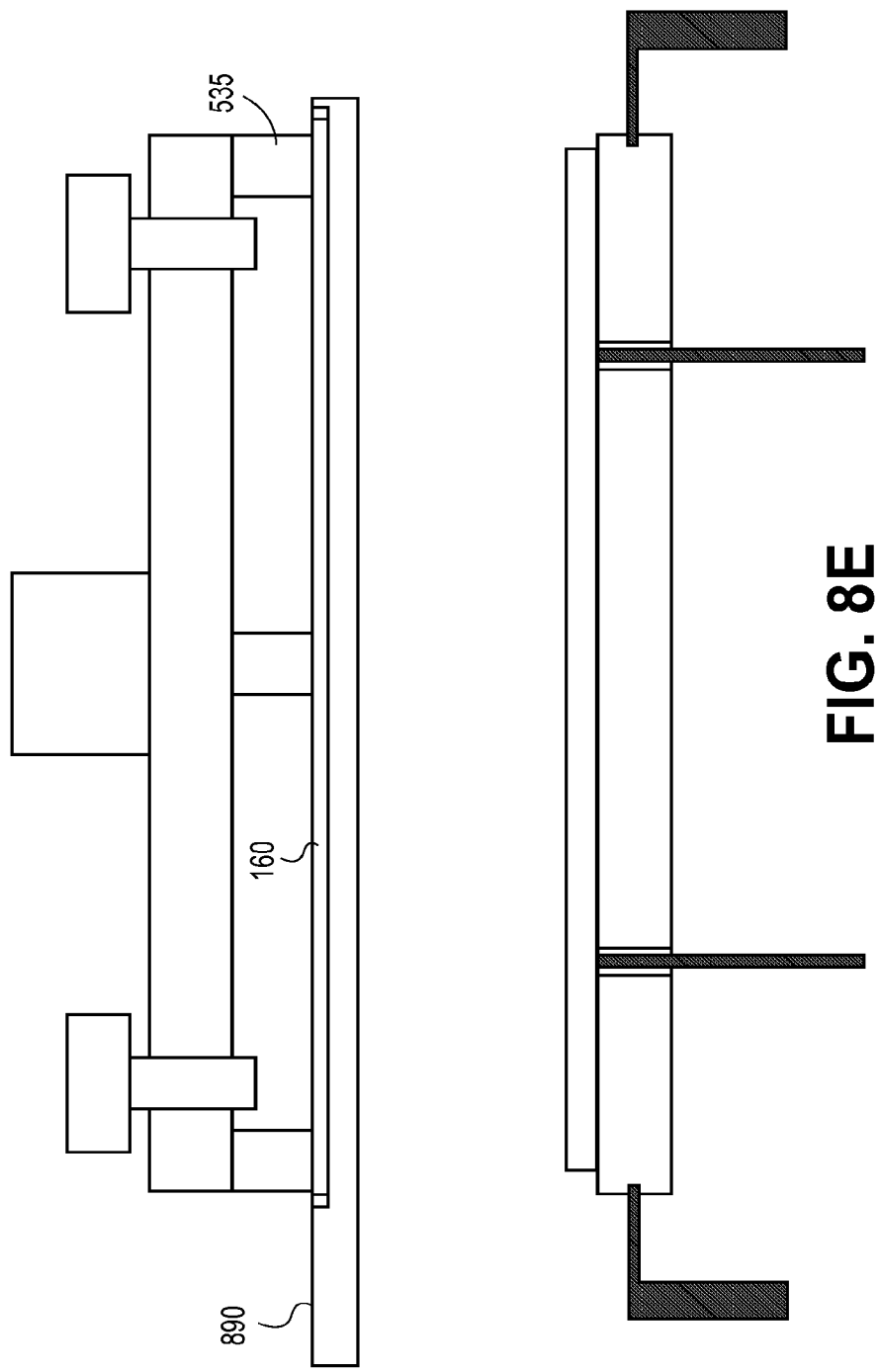

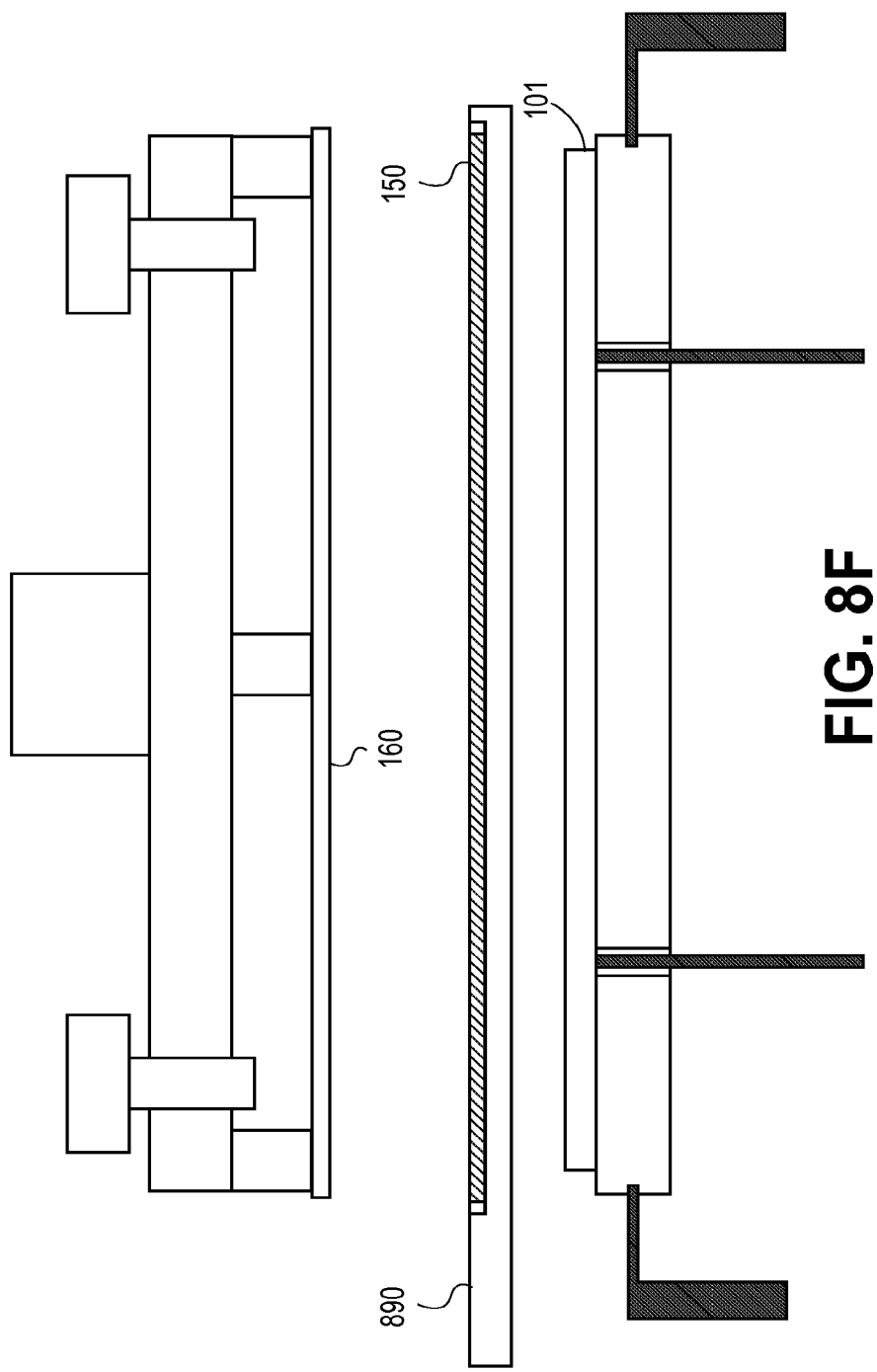

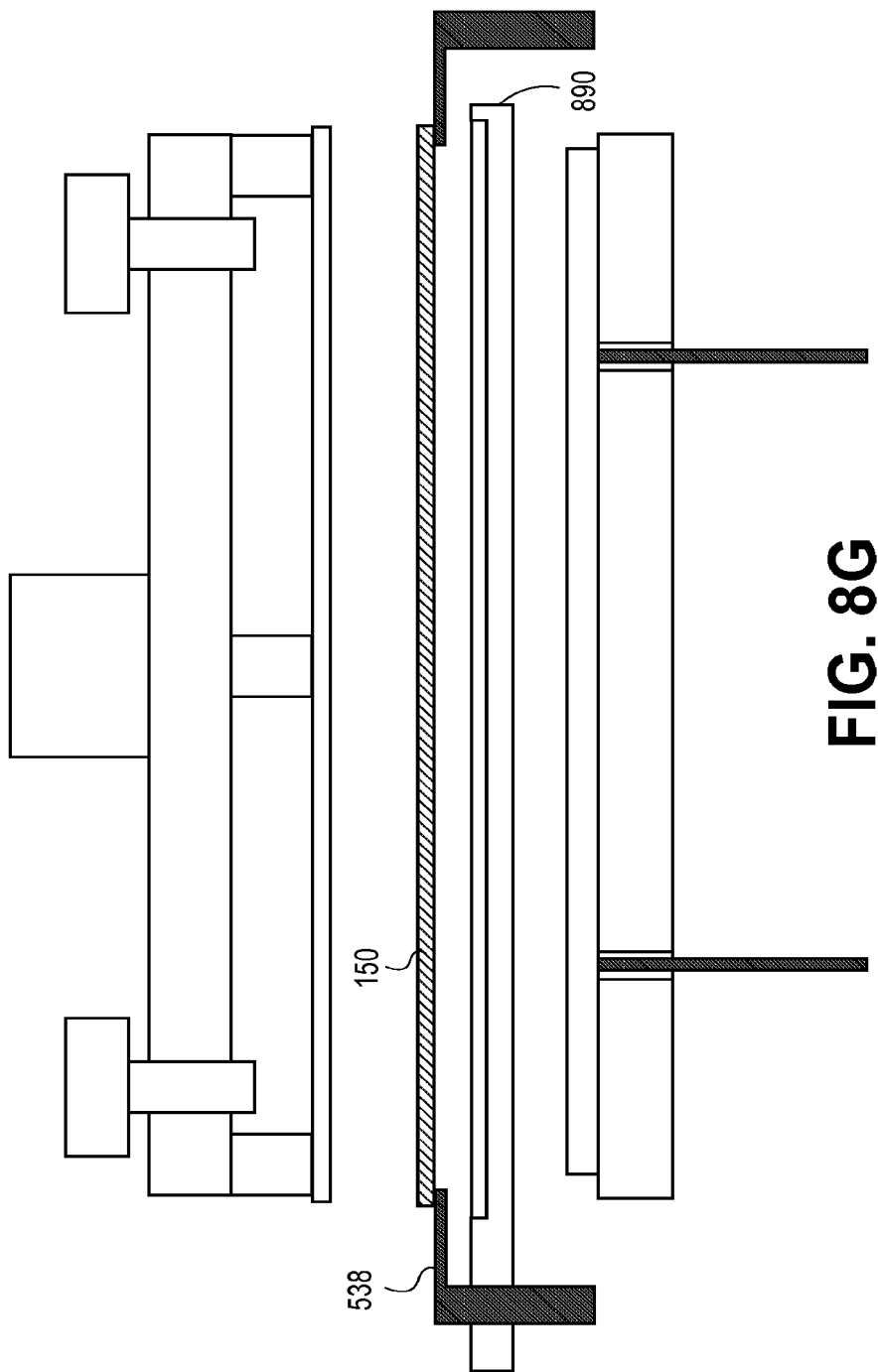

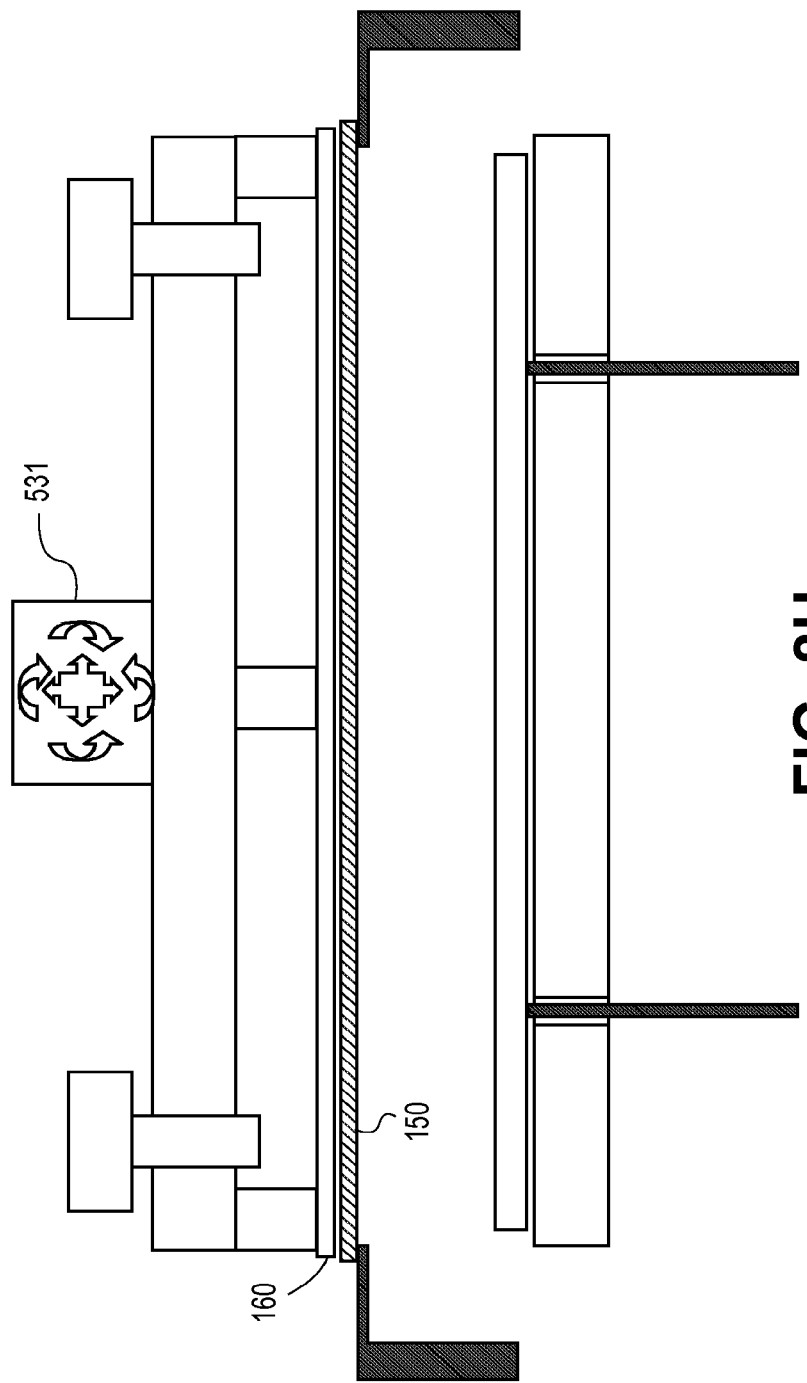

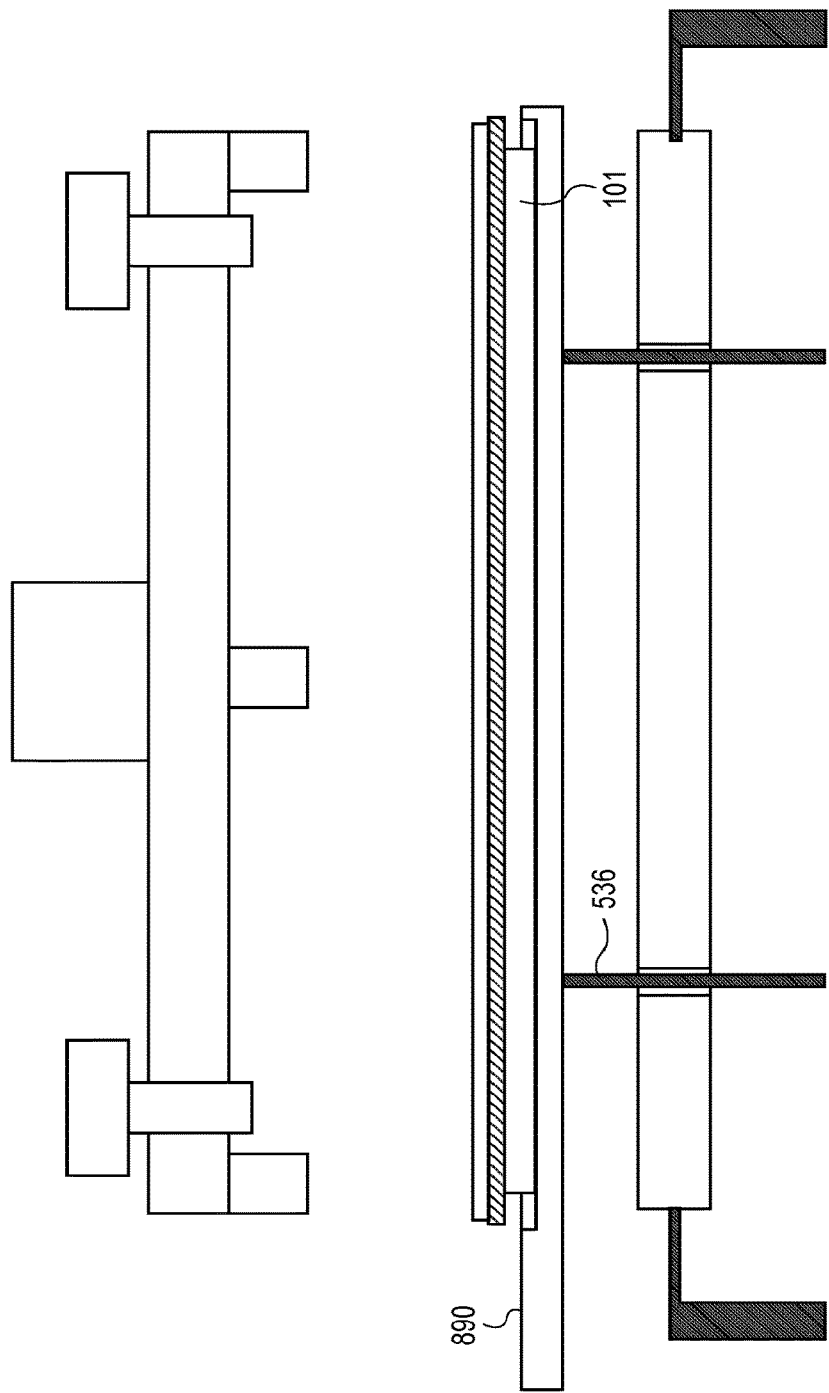

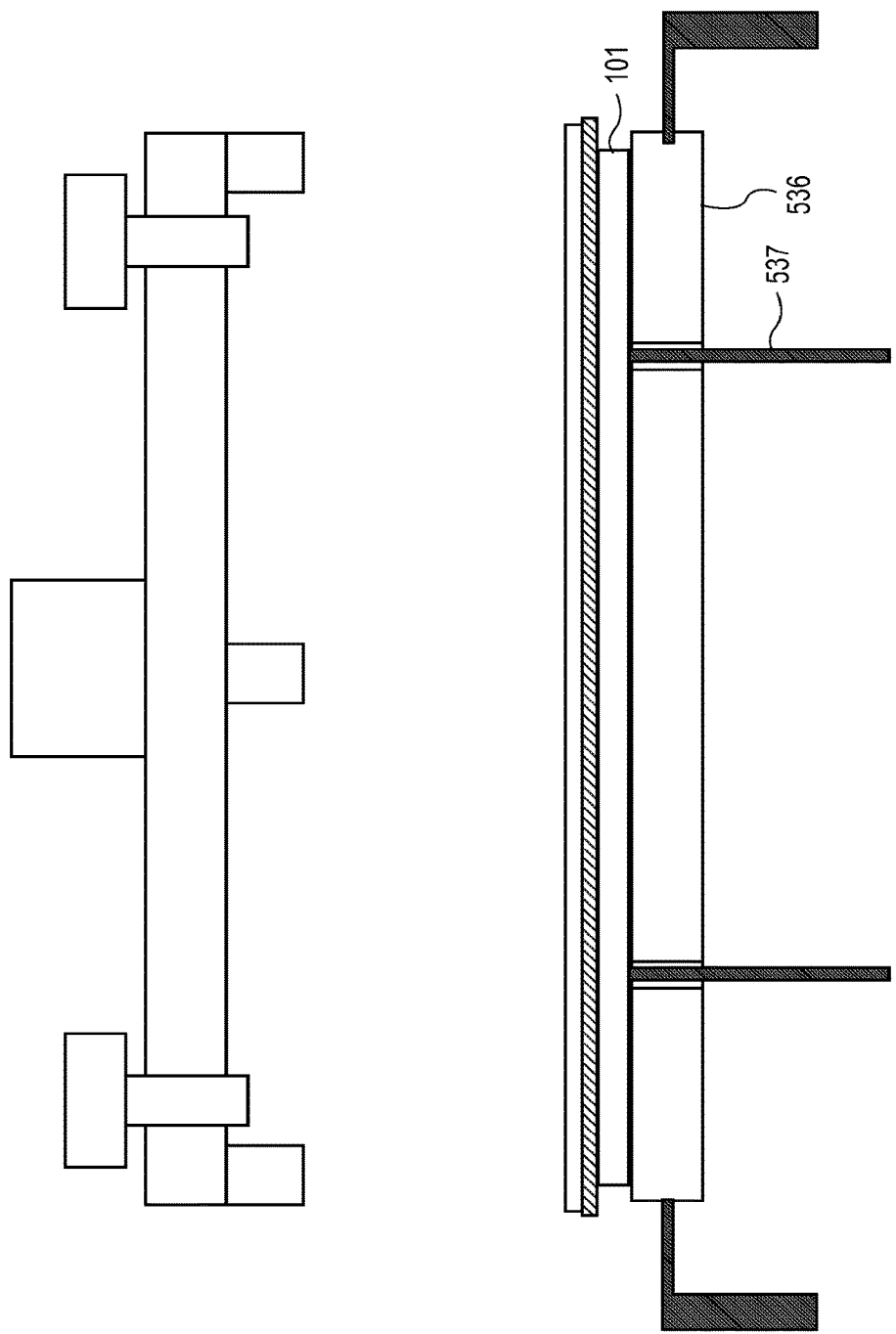

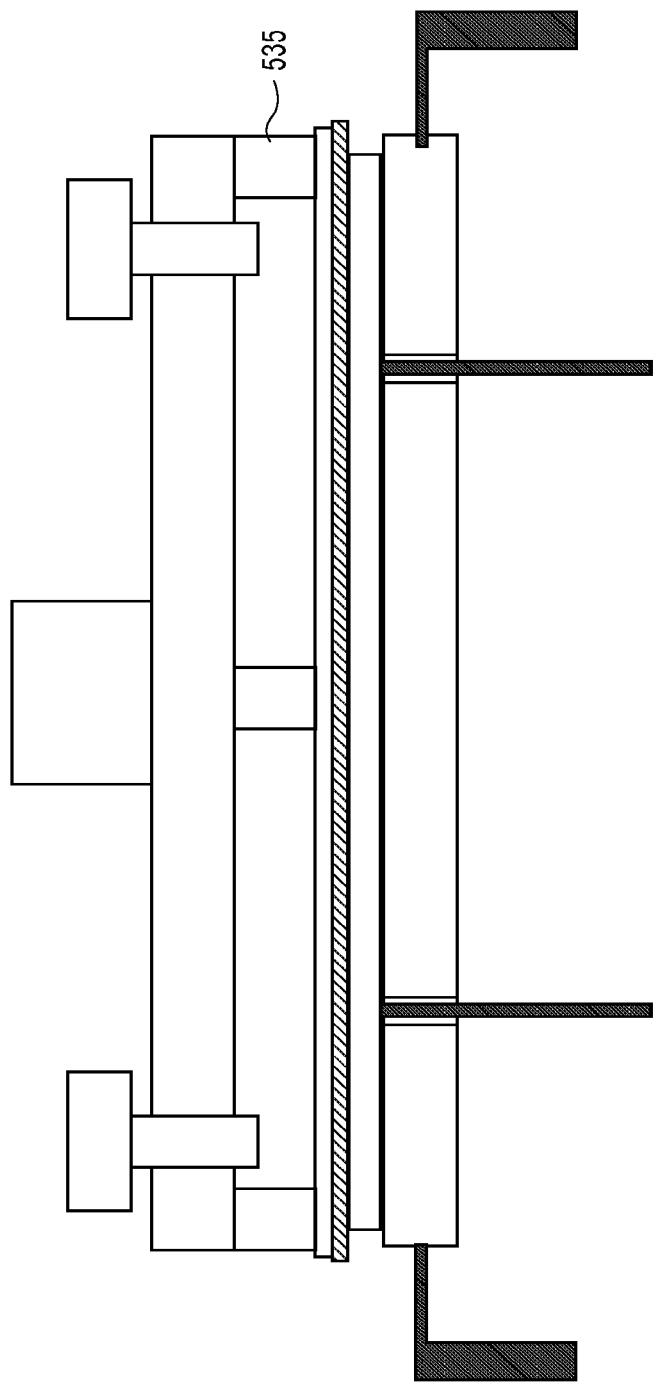

SHADOW MASK ALIGNMENT AND MANAGEMENT SYSTEM

CROSS-REFERENCE TO RELATED APPLICATIONS

This application is a divisional application of and claims the benefit of co-pending U.S. Non-Provisional application Ser. No. 12/905,460, filed Oct. 15, 2010, which claims benefit to U.S. Provisional Application No. 61/255,426, filed Oct. 27, 2009, the entire contents of which are hereby incorporated by reference in their entirety for all purposes.

FIELD

Embodiments of the present invention pertain to the field of thin-film batteries and, in particular, to shadow mask fixation and alignment systems and methods.

DESCRIPTION OF RELATED ART

Recent efforts towards scaling the dimensions of thin-film batteries (TFB) to include ever smaller features while increasing capacities for high volume manufacturing of such thin-film batteries have mostly relied on traditional thin-film battery manufacturing methods and techniques. Such traditional methods and techniques may include the use of a shadow mask, or a set of shadow masks, at each and every deposition operation in a typical thin-film battery process flow. For example, in a conventional process, a processing tool is loaded with a shadow mask, deposition of a single layer is performed in the processing tool, and a first shadow mask is then unloaded for replacement with a second shadow mask intended for another deposition operation.

The overhead associated with shadow masks may be considerable as well as lead to yield loss in the event of misalignment. Where shadow masks are used for structured deposition of several layers, the accuracy in interlayer alignment becomes very important. In such applications, integrity in pattern transfer requires close proximity and mechanical stability between the substrate and the shadow masks as well as alignment tolerances in the micron range. Techniques of affixing shadow masks which enable reductions in such overhead and yield loss are therefore advantageous.

SUMMARY OF DESCRIPTION

A magnetic handling assembly for thin-film processing of a substrate is described. Embodiments of the assembly includes a magnetic handling carrier and a shadow mask disposed over, and magnetically coupled to, the magnetic handling carrier to cover a top of a workpiece that is to be disposed between the shadow mask and the magnetic handling carrier when exposed to a processing condition.

A system for assembling and disassembling a shadow mask to cover a top of a workpiece for exposure to a processing condition is also described. Embodiments of the system include a first chamber with a first support to hold the shadow mask, a second support to hold a handling carrier, and an alignment system to align the shadow mask a workpiece to be disposed between the carrier and shadow mask. The first and second supports are moveable relative to each other, in response to output from the alignment system, to bring the workpiece into contact with the shadow mask.

A method for handling a shadow mask to cover a top of a workpiece for exposure to a processing condition is also described. Embodiments include disposing a handling carrier on a first support, disposing a shadow mask on a second support, aligning, with a computer-controlled multi-axis stage, a first pattern feature of the shadow mask to a second pattern feature of a workpiece by moving the first support a first distance relative to the second support. The aligned shadow mask may then be coupled with the handling carrier by moving the first support a second distance relative to the second support to bring a bottom surface of the aligned shadow mask into a magnetic field of the handling carrier.

BRIEF DESCRIPTION OF THE DRAWINGS

FIG. 6B illustrates a flowchart representing operations in a method for disassembling a shadow mask/workpiece/magnetic handling carrier stack, in accordance with an embodiment of the present invention.

FIGS. 8A, 8B, 8C, 8D, 8E, 8F, 8G, 8H, 8J and 8K illustrate a cross-sectional view of operations the method shown in FIG. 6A for assembling a shadow mask/workpiece/magnetic handling carrier stack with the shadow mask alignment chamber illustrated in FIG. 5B, in accordance with an embodiment of the present invention.

FIGS. 9A, 9B, 9C, 9D, 9E, 9F illustrate a cross-sectional view of operations in the method shown in FIG. 6B for disassembling a shadow mask/workpiece/magnetic handling carrier stack with the shadow mask alignment chamber illustrated in FIG. 5B, in accordance with an embodiment of the present invention.

DETAILED DESCRIPTION

Shadow mask fixation and shadow mask alignment methods and apparatuses are described. In the following description, numerous specific details are set forth, such as component materials, component combinations, equipment platforms and processing operations in order to provide a thorough understanding of the present invention. It will be apparent to one skilled in the art that the present invention may be practiced without one or more of these specific details. In other instances, well-known features, such as pattern recognition algorithms, equipment control algorithms and the like are not described in detail in order to not unnecessarily obscure the present invention. Furthermore, it is to be understood that the various exemplary embodiments shown in the figures are illustrative representations and are not necessarily drawn to scale.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate.

Figure 1:
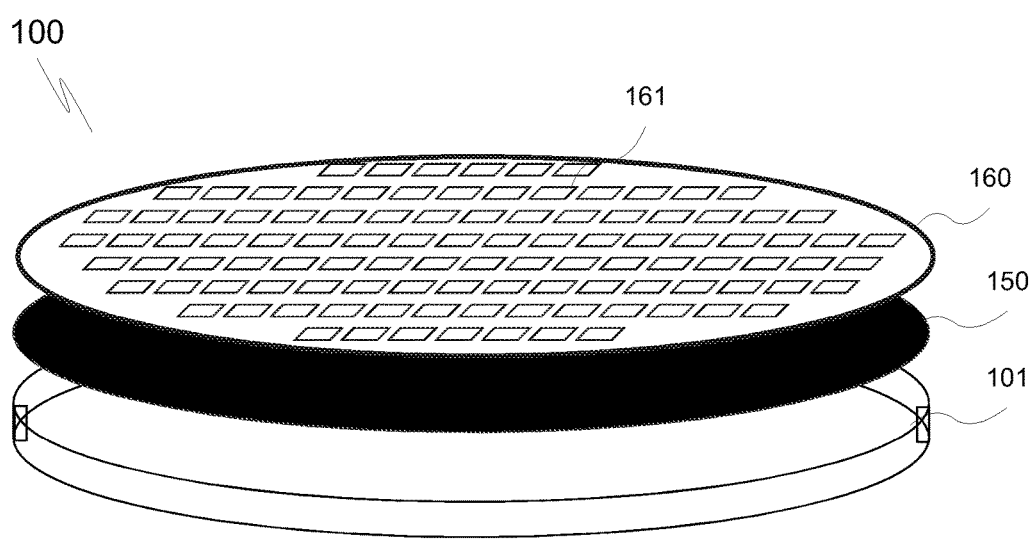
FIG. 1 depicts an isometric view of a shadow mask/workpiece/magnetic handling carrier stack, in accordance with an embodiment of the present invention.

FIG. 1 depicts an isometric view of a shadow mask/workpiece/magnetic handling carrier stack 100, in accordance with an embodiment of the present invention. The shadow mask/workpiece/magnetic handling carrier stack 100 includes at least a shadow mask 160 and a magnetic handling carrier 101 with a workpiece 150 there between. Generally, the shadow mask 160 is to be disposed over a film surface of the workpiece 150 which is to be selectively exposed to a processing condition (deposition, etch, etc.) based on the pattern features 161 of the shadow mask 160. In a particular embodiment, the shadow mask 160 is disposed on the workpiece 150, in direct contact with a surface film of the workpiece 150 to be selectively exposed to the processing condition. Direct contact between the shadow mask 160 and the surface film of the workpiece 150 enables processing with high fidelity to the pattern features 161 as any gap between the shadow mask 160 and workpiece 150 may lead to deposition below the shadow mask 160 (e.g., beyond the opening of the pattern features 161), resulting in an unacceptable overlap between various deposited layers of a device (e.g., TFB). In preferred embodiments, the shadow mask 160 thickness is minimized to reduce the shadowing effect, whereby the sidewall of the shadow mask affects the thickness uniformity of the layers within patterned areas of the workpiece 150. Generally, the thickness of the shadow mask 160 is a function of at least the material chosen and the area of the mask with the minimum thickness limit being that which can be handled by automated equipment as an atomic unit (e.g., loaded from a storage module and assembled onto a workpiece, as described elsewhere herein). As one example, an Invar shadow mask 160 with an outer diameter of approximately 185 to 200 mm (for 200 mm diameter "work piece") and has a thickness of 150 to 250 ☐m)

The workpiece 150 may be any substrate conventional in the manufacture of thin film devices, such as TFB and the like. The shadow mask 160 may be of any magnetically susceptible material, such as, but not limited to ferromagnetic and ferrimagnetic materials. The mask may be made of the same material as the work piece 150 discussed in more detail elsewhere herein. This will minimize the thermal expansion coefficient induced distortion between the mask and the work piece. In specific embodiments, the shadow mask 160 comprises a magnetic metal, such as, but not limited to, nickel or cobalt alloys of iron. In one particular embodiment, the shadow mask 160 is 64FeNi (FeNi36), commonly known as Invar,® which is known to have a low thermal expansion coefficient. In alternative embodiments, the shadow mask 160 includes material that is non-magnetic, where magnetic material is incorporated into the mask to form a composite mask (e.g., separate magnetic pieces embedded into a non-magnetic bulk, etc.).

Generally, the magnetic handling carrier 101 is to magnetically coupled with the shadow mask 160 to magnetically affix the shadow mask 160 to the workpiece. Magnetic fixation may be superior to mechanical fixation because the coupling force can be controlled to better keep the mask parallel to the substrate and reduce bowing (from thermal expansion during deposition). Also, as is further described elsewhere herein, particle generation issues can be mitigated for magnetic fixation techniques in manners which are not generally possible for mechanical fixation techniques. In preferred embodiments, the dimensions of the magnetic handling carrier 101 are such that the magnetic handling carrier 101 has a major surface area at least as large as the workpiece to ensure even heating and support. In one embodiment, the outer diameter of the magnetic handling carrier 101 is approximately 190 mm. The thickness of the carrier is sufficient to house a magnet and be sufficiently rigid that it may be reliably handled separately from the workpiece 150 and shadow mask 160. As such, the magnetic handling carrier 101 provides mechanical stability during handling allowing affixation of the shadow mask 160 with even brittle ceramic magnets. Generally, overall carrier thickness depends on the thickness of magnetic material utilized in the carrier. Magnetic material thicknesses between 3 and 5 mm would be typical, although thicknesses outside this range could also be utilized. For magnetic materials in the 3-5 mm range, the carrier 101 may have a thickness of 4-7 mm. In one exemplary embodiment, the thickness is approximately 4.5 mm.

Figure 2A:
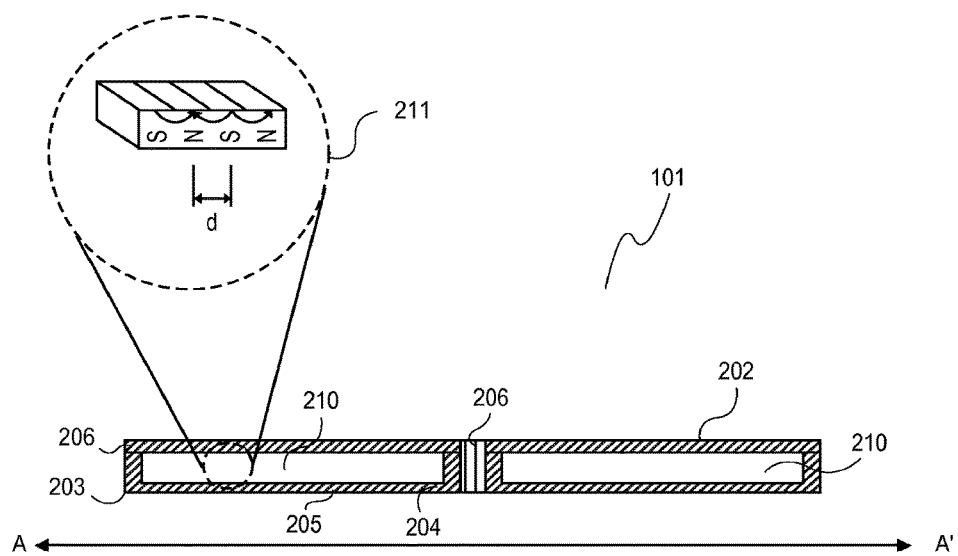
FIG. 2A illustrates a cross-sectional view of the magnetic handling carrier, in accordance with an embodiment of the present invention.

FIG. 2A illustrates a cross-sectional view of one exemplary embodiment of the magnetic handling carrier 101. As illustrated, the cross-section is along the line A-A', which is further shown in FIG. 2B. A high temperature compatible magnet 210 is encapsulated in a protective casing 203. Encapsulation of the magnet 210 reduces problems of mechanical instability and particle generation during operation/handling in processing equipment. In a particularly advantageous embodiment, the magnet 210 is vacuum encapsulated within the protective casing 203. Such vacuum encapsulation may reduce the risk of gas expansion caused by thermal loading resulting from processing of the workpiece 150. In an alternate embodiment illustrated in FIG. 2C, the protective casing 203 is open to surrounding atmosphere, which can be advantageous in terms of constant pressure cycling between deposition chamber and normal atmosphere. For such an embodiment, thermal stress can be further accommodated by placing "cut outs" 209 on the a side (e.g., bottom side depicted) of the carrier 101 capable of accommodating expansion and contraction between varying thermal environments.

Depending on the embodiment, the protective casing 203 may be of a number of different materials, such as but not limited to, metals, dielectrics and semiconductors. The casing materials can also be anodized or coated with "hard surface coatings" to reduce mechanical abrasion induced particle generation. In one advantageous embodiment, the protective casing 203 is of a readily machined, resilient and light material, such as aluminum. For embodiments, a plate 205 may be machined to include a recess 204 to contain the magnet. A cover 202 is then welded, bond, screwed, or otherwise affixed (under vacuum for vacuum encapsulation embodiments) to the magnet loaded plate 205. In one exemplary embodiment, the plate 205 is an aluminum plate of approximately 4 mm in thickness with an outer diameter of approximately 200 mm (for 200 mm diameter substrates) and containing a recess depth of approximately 3 mm, bonded to a cover 202 having a thickness of approximately 0.5 mm. Other dimensions are of course possible, depending on the materials selected and the dimension of the workpiece 150.

Depending on the embodiment, the magnetic handling carrier 101 comprises a permanent or semi-permanent magnet or an electromagnet. For preferred permanent magnet embodiments, the magnet 210 can be simply poled (single N—S) or a multiple bi-polar composite magnetic with alternating N and S poles as illustrated by the magnified inset 211. In the second case, the alternating poles can be rectilinear or radial. A third embodiment has magnets much smaller than the magnetic handling carrier 101 dispersed within the encasing to localize the magnetic field and minimize the potential interaction between incoming ions (from deposition) and the magnetic field emanated from the magnetic handling carrier 101. The magnet(s) may be of any conventional magnetic metal or ceramic as thermal resistance or mechanical stability (leading to particle issues) considerations are mitigated by the protective casing 203.

Figure 2B:
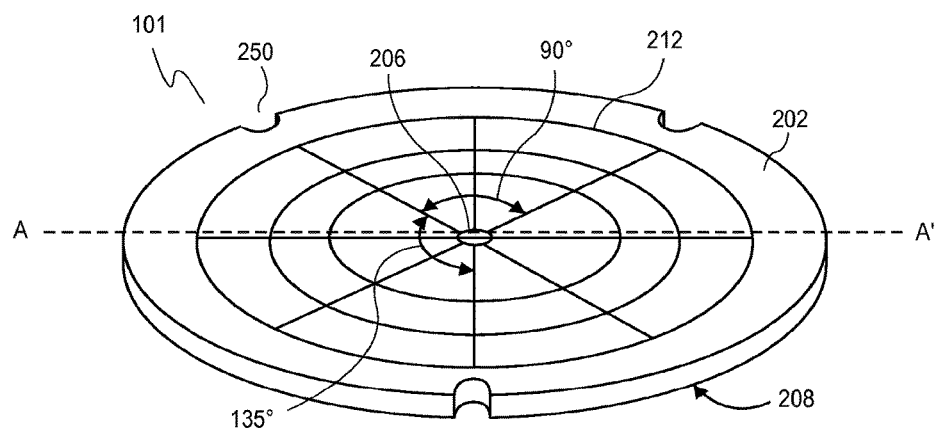
FIG. 2B illustrates a top down isometric view of a magnetic handling carrier, in accordance with an embodiment of the present invention.
Figure 2C:
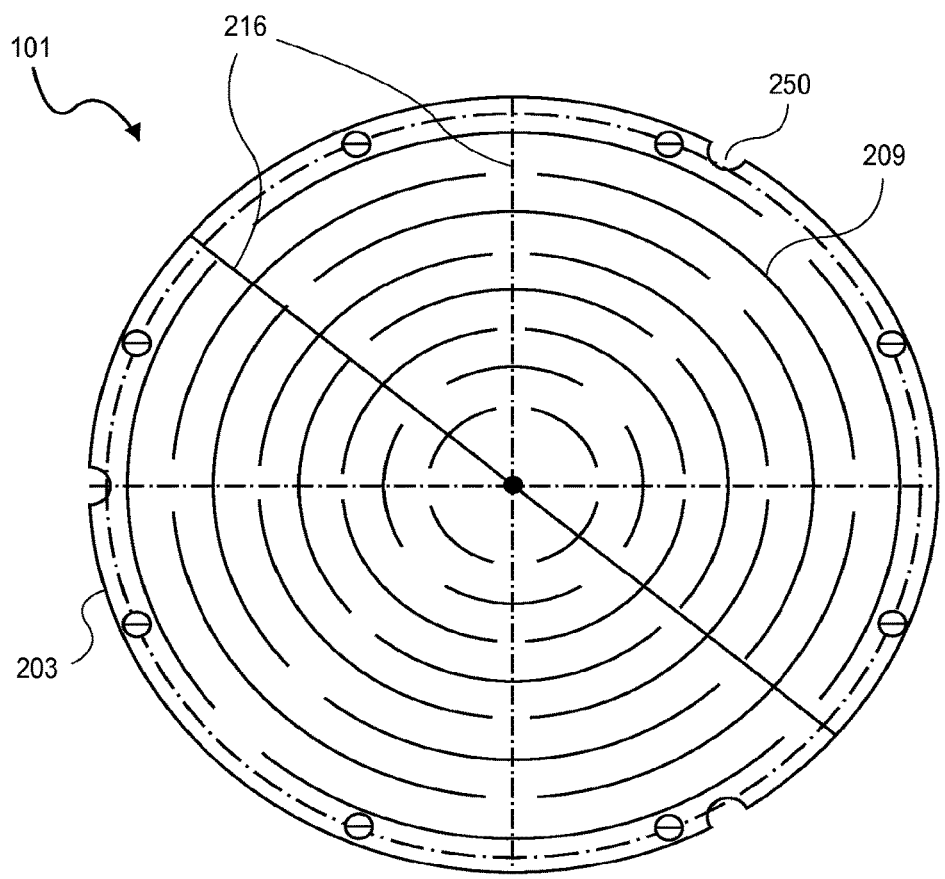
FIG. 2C illustrates a bottom up plan view of a magnetic handling carrier, in accordance with an embodiment of the present invention.

FIG. 2B illustrates a top down isometric view of the magnetic handling carrier 101, in accordance with an exemplary embodiment of the present invention. As illustrated, the cover 202 is machined to include patterned grooves 212 to allow a backside gas to flow between the workpiece 150 and magnetic handling carrier 101 providing cooling to the workpiece 150 when disposed on the magnetic handling carrier 101. The patterned grooves 212 are coupled to a through hole 206 passing from a bottom side 208 to a top side of the cover 202. The through hole 206 fluidly connects the patterned grooves 212 to an underlying coolant source, such as a backside helium, argon, or nitrogen, provided by a chuck or pedestal of a processing apparatus (e.g., a PVD chamber) upon which the bottom side 208 is disposed during processing of the workpiece 150 when assembled as a shadow mask-workpiece-magnetic handling carrier stack 100. While the patterned grooves 212 may have any design, in an exemplary embodiment the grooves are approximately 0.1-0.2 mm in depth, have a width of approximately 2 mm and circumscribe a 200 mm O.D. magnetic handling carrier 101 at radial distances of approximately 30-40 mm, 50-60 mm, and 80-90 mm. For such patterned groove dimensions, the diameter of through hole 206 may vary between approximately 3 mm and 10 mm and is preferably between approximately 4 mm and 6 mm. As further shown in FIG. 2B, the magnetic handling carrier 101 includes notches 250 to accommodate aligner operations and/or component handling. For example, outer lift pins may pass through the notches 250 to contact either of the workpiece 150 or shadow mask 160, as described elsewhere herein. In the exemplary embodiment depicted, a plurality of notches 250 are provided at 0°, 90° and 135°, although many other configurations are also possible. There may be additional notches (e.g., features 212 in FIG. 2C) on a front or back side of any of the components (mask, workpiece, and carrier), and corresponding "guiding pins" on "aligner stages" to allow specific and relative orientation between each of the components.

In an embodiment, the magnetic handling carrier 101 includes a plurality of defined magnetic regions having significantly different magnetic field strengths. The plurality of defined magnetic regions provides magnetic field strength fluctuations in a controlled and localized fashion. Such deliberate localized field variations reduce the potential that an uncontrolled non-uniformity of the magnetic field (e.g., from magnet to magnet across the carrier 101, from non-uniform material composition of a full-face magnet, etc.) will cause uncontrolled expansion along an irregular direction during processing of the workpiece 150 (e.g., deposition). Controlled expansion is advantageous because randomized distortion contributing to the cumulative misalignment is reduced. By providing a defined region of stronger magnetic field, the defined region controllably becomes a "fixed" point of attachment from which the shadow mask 160 expands, leading to consistent and reduced distortion in the masks. Because the provision of predetermined, localized stronger magnetic field regions may reduce thermal expansion mismatch induced distortion, if the processing temperature of various successive processing operations is constant (which may be done for TFB production in particular) then the contribution of thermal expansion to the "overall misalignment" is made consistent. This in turn leads to reduce misalignment between layers.

Figure 3:
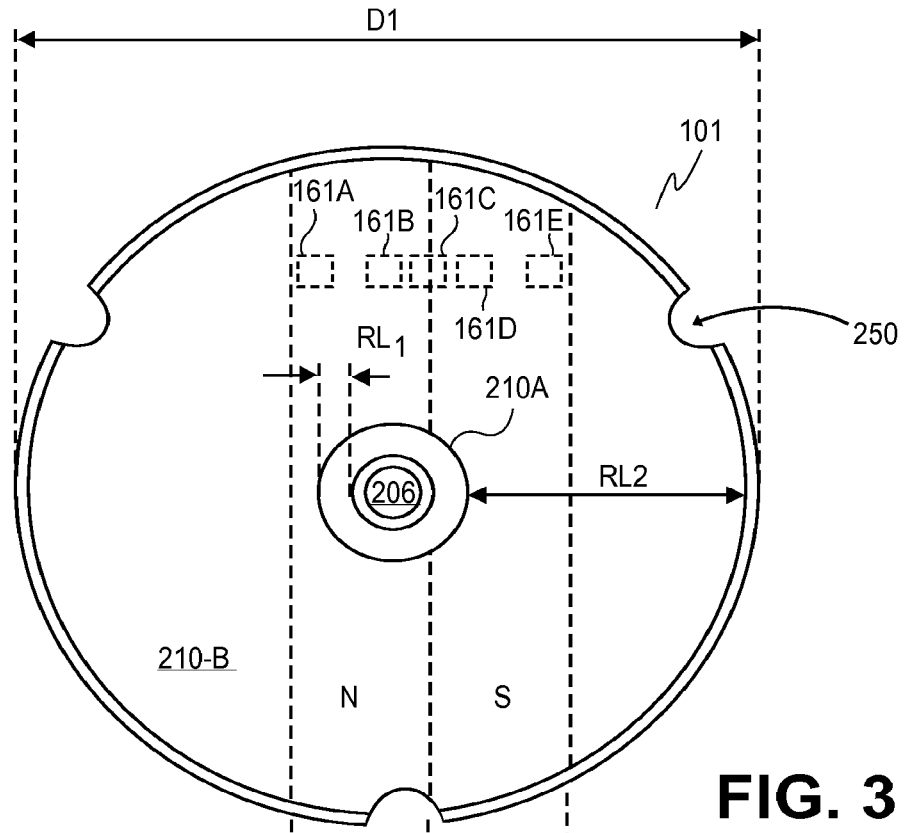
FIG. 3 illustrates a top-down plan view of a magnetic handling carrier, in accordance with an embodiment of the present invention.

FIG. 3 illustrates a plan view of the exemplary magnetic handling carrier 101, in accordance with an embodiment. As illustrated, magnet 210 is divided into a first magnetic region 210-A and a second magnetic region 210-B. In one embodiment, the first magnetic region 210-A has a stronger magnetic field than the second magnetic region 210-B. For the exemplary embodiment, the first magnetic region 210-A extends along a first radial length, RL1, extending from a first radial distance proximate to an axial center (e.g., through hole 206) to a second radial distance distal from the through hole 206. The second magnetic region 210-B extends along a second radial length, RL2, extending from a first radial distance equal to or greater than RL1 from the axial center (e.g., through hole 206) to a second radial distance proximate outer radius of the magnetic handling carrier 101 (e.g., approximately one half the outer diameter D1). This exemplary arrangement of the first magnetic region 210-A ensures a center of the magnetic handling carrier 101 remains magnetically affixed to the shadow mask 160 and the total amount of thermal expansion mismatch induced distortion across the outer diameter D1 is divided to approximately one half with symmetrical distortion having a maximum at a distance RL1+RL2 from the carrier center (e.g., through hole 206). While the exemplary embodiment depicted includes two annular magnetic regions 210-A and 210-B, other arrangements with a greater number of magnetic regions are of course possible and within the scope of the present invention.

Figure 4:
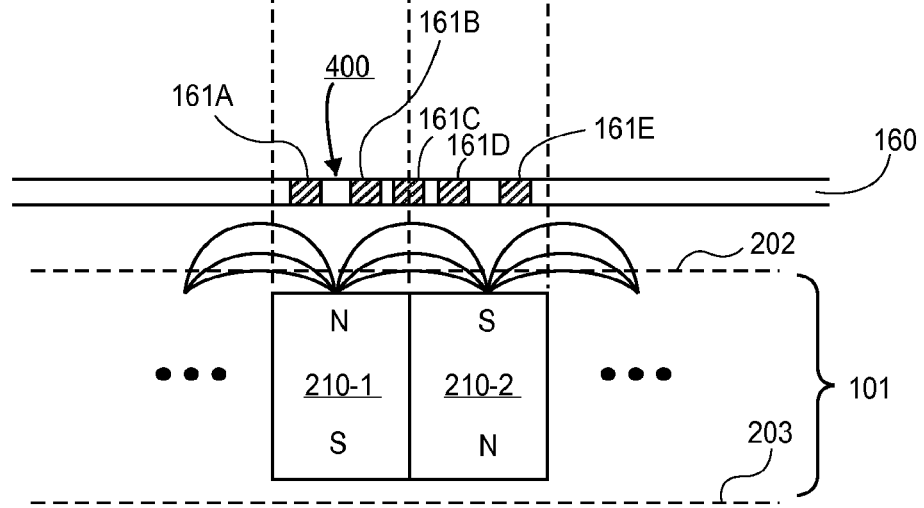
FIG. 4 illustrates a schematic diagram of magnetic pole orientations within a magnetic handling carrier, in accordance with an embodiment of the present invention.

FIG. 4 illustrates a schematic diagram of magnetic pole orientations within a magnetic region of a handling carrier, such as magnetic handling carrier 101, in accordance with an embodiment. As illustrated, magnets 210 within magnetic regions (e.g., first magnetic region 210-A or second magnetic region 210-B of FIG. 3) have an alternating bi-polar arrangement along a radial distance of a magnetic handling carrier (210-1, 210-2, etc.) to maximize a perpendicular field extending beyond the cover 202. Charged particles 400 present in a processing environment may follow such field lines, preferentially accelerating toward certain regions of a coupled workpiece. In particular embodiments therefore, a single uniformly magnetized magnet may be employed for the magnetic handling carrier 101 with one pole proximate to the cover 202 and a second pole proximate to the bottom of the protective casing 203 (i.e. a "full-face" magnet). In other embodiments, the axis of the magnetic field is aligned with a die pattern map of the shadow mask 160 to position magnetic anomalies between the devices being manufactured. For example, the magnetic regions 210-1 and 210-2 illustrated in FIG. 4 are projected onto the plan view of the magnetic handling carrier 101 shown in FIG. 3. Anomalous magnetic fields at either the domain interfaces or at pole centers may be positioned relative to the shadow mask 160 to have the smallest impact on die characteristics. Relative orientations between a die map and specific magnetic regions may be achieved with a rough alignment (i.e., "pre-alignment") based on notches and corresponding "guiding pins" on an aligner platform. From a rough alignment achieved at a pre-alignment operation, a subsequent final "pattern recognition based" mask alignment may be performed.

In the exemplary embodiment depicted in FIGS. 3 and 4, each of the magnetic regions 210-1 and 210-2 are large enough to contain a plurality of shadow mask openings 161 and therefore a plurality of die are formed within each region 210-1 and 210-2. As illustrated, shadow mask openings 161-A and 161-B are to be disposed over region 210-1 while a non-device region between mask openings 161-A and 161-B is disposed over a pole center. Alternatively, mask openings may be disposed over magnetic regions to be spaced away from magnetic domain interfaces, as illustrated for mask opening 161-E which is spaced apart from the edge of magnetic region 210-2, or over magnetic domain interfaces, as illustrated for mask opening 161-C.

For embodiments as depicted in FIG. 3 which include a first magnetic region 210-A and a second magnetic region 210-B, each of the first and second regions may include a single uniformly magnetized magnet. In other embodiments, a plurality of much smaller magnets rather than full face magnet is employed in one or more magnetic regions (e.g., 210-A and/or 210-B). In certain such embodiments, the magnetic strength may be reduced for a first plurality of magnets (e.g., in region 210-B) to minimize the effects of field lines on the processing environment for the majority of the workpiece while a second plurality of magnets (e.g., in region 210-A) may be employed to ensure sufficiently strong fixation near a center of the shadow mask 160.

Figure 5A:
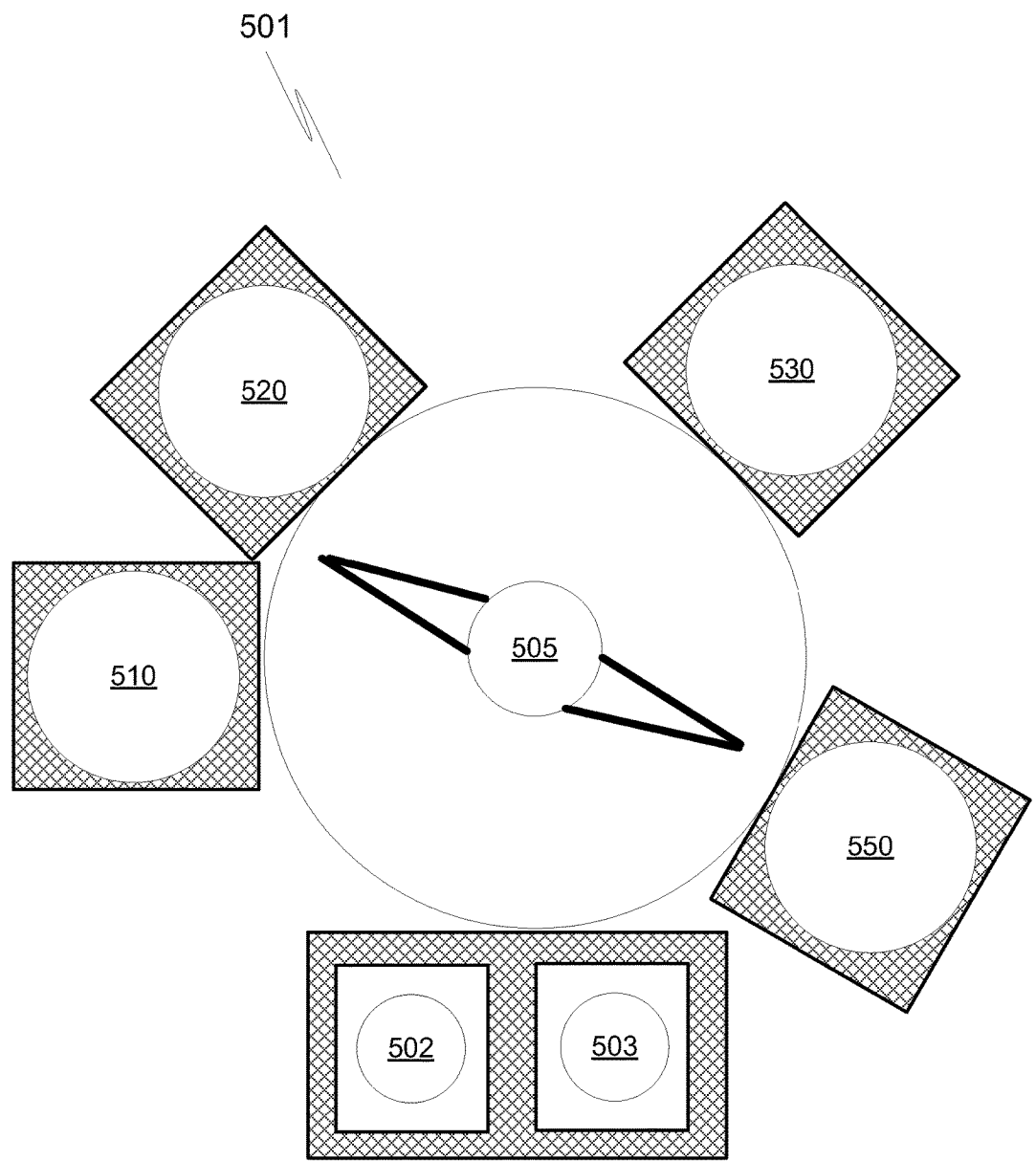
FIG. 5A illustrates a schematic diagram illustrating a plan view of an automated shadow mask assembly/disassembly system, in accordance with an embodiment of the present invention.

FIG. 5A illustrates a schematic diagram illustrating a plan view of an automated shadow mask assembly/disassembly system 501, in accordance with an embodiment. The system 501 is generally a robotic platform capable of servicing a plurality of modules. In certain embodiments, the system 501 may be a Centura® or Endura® platform commercially available from Applied Materials of Santa Clara, Calif. In alternative embodiments, other commercially available platforms utilized in semiconductor fabrication may also be adapted to perform the shadow mask assembly/disassembly operations in an automated manner as described herein. The exemplary system 501 includes a central robotic handling module 505 coupled to load/unload ports 502/503 to/from which disassembled and assembled shadow mask-workpiece-carrier stacks described herein may be accessed.

Figure 5B:
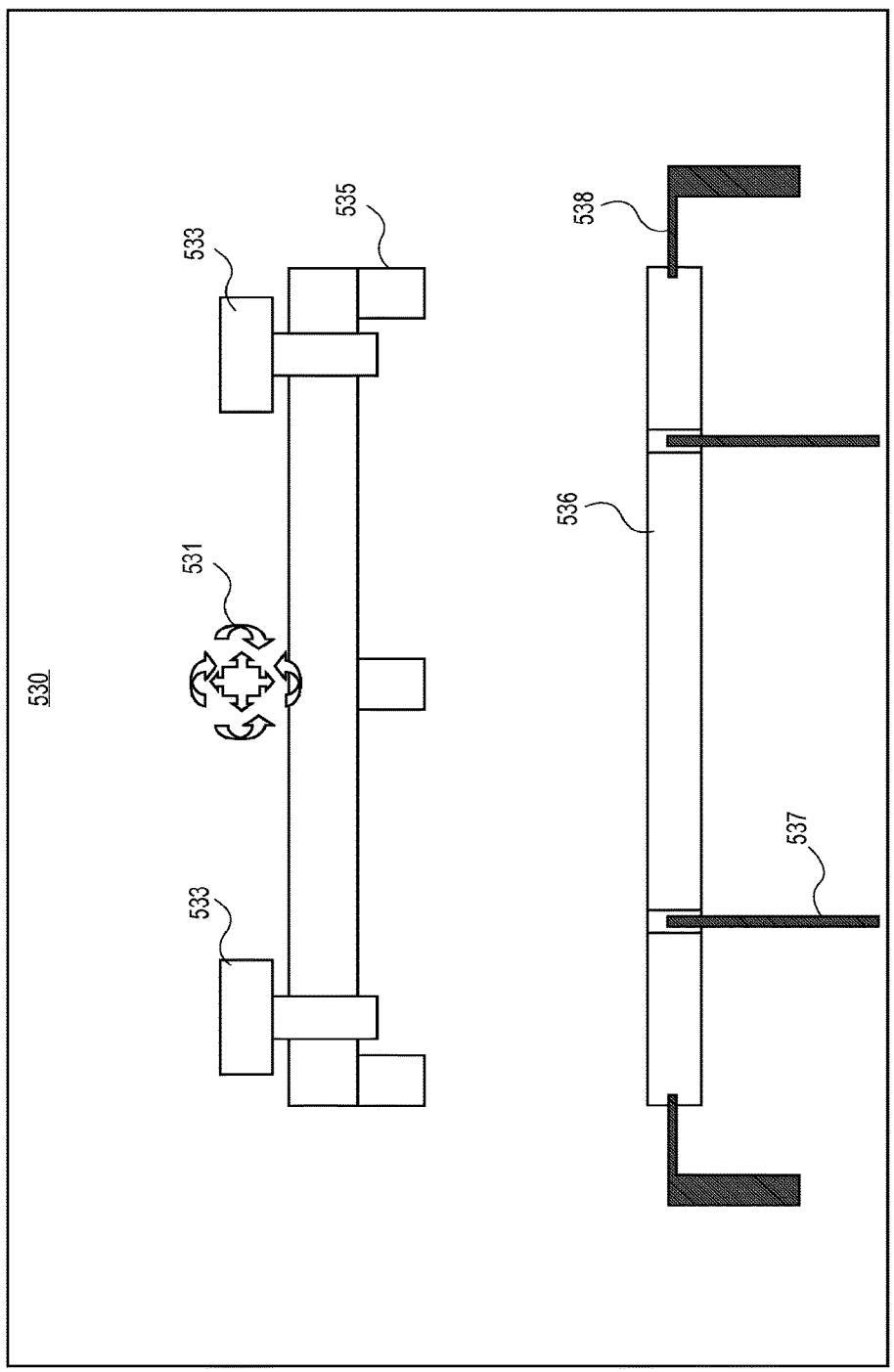
FIG. 5B illustrates a schematic diagram illustrating a cross-sectional view of a shadow mask alignment chamber, in accordance with an embodiment of the present invention.

In an embodiment, the system 501 further includes an alignment chamber 530 in which at least a portion of a shadow mask/workpiece/magnetic handling carrier stack, such as shadow mask/workpiece/magnetic handling carrier stack 100 is assembled and/or dissembled. The alignment chamber 530 includes an alignment system capable of aligning a shadow mask to a workpiece. In the exemplary embodiment depicted in FIG. 5B, the alignment chamber 530 includes a CCD-based optical pattern recognition system 533. However, other alignment systems, such as optical interference-based systems (e.g., employing scatterometry techniques), may also be used. As depicted in FIG. 5B, at least one of a head 531 or pedestal 536 is capable of multi-axis travel to effect the alignment between the head 531 and pedestal 536 as controlled in response to output from the CCD-based optical pattern recognition system 533. For the exemplary alignment chamber 530 the head 531 is configured for multi-dimension (e.g., 6-D) movement relative to the pedestal 536. The head 531 further includes a holder 535 with a vacuum or electromagnetic system adapted to hold one or more of a shadow mask or workpiece during assembly and/or disassembly of a shadow mask/workpiece/magnetic handling carrier stack described elsewhere herein.

In an embodiment, the pedestal 536 is configured to provide a vacuum or electromagnetic system for holding one or more of a magnetic handling carrier or workpiece. For the exemplary embodiment depicted in FIG. 5B, an inner lift 537 and an outer lift 538 are coupled to the pedestal 536 with each lift capable of independent operation. In a preferred embodiment, the inner lift 537 is adapted to lift/lower a magnetic handling carrier, such as magnetic handling carrier 101, onto/away from the pedestal 536 (away from/toward head 531) while the outer lift 538 is adapted to lift/lower a workpiece, such as workpiece 150, onto/away from the pedestal 536 (away from/toward head 531) during assembly/disassembly operations, as described elsewhere herein.

Returning to FIG. 5A, the exemplary system 501 further includes a pre-aligner 550, which may employ any workpiece alignment means conventional to semiconductor processing cluster tools. For example, the pre-aligner 550 may be configured to provide rotational alignment of a workpiece loaded from the ports 502/503 accurate to +/−0.5 degrees. As further illustrated, system 501 also includes a shadow mask storage module 510 and a handling carrier storage module 520. Storage module 510 may be configured to provide shadow mask management functions to facilitate assembly of a workpiece with a predefined shadow mask. For example, a magazine of shadow masks may be stored within the shadow mask storage module 510 and an indexer may provide a particular shadow mask defined by a recipe parameter field of a recipe being executed by the system 501. Similarly, a plurality of handling carriers, such as magnetic handling carrier 101, may be stored and indexed or otherwise made accessible to the robotic handling module 505 during execution of assembly/disassembly sequence, as described elsewhere herein.

Figure 6A:
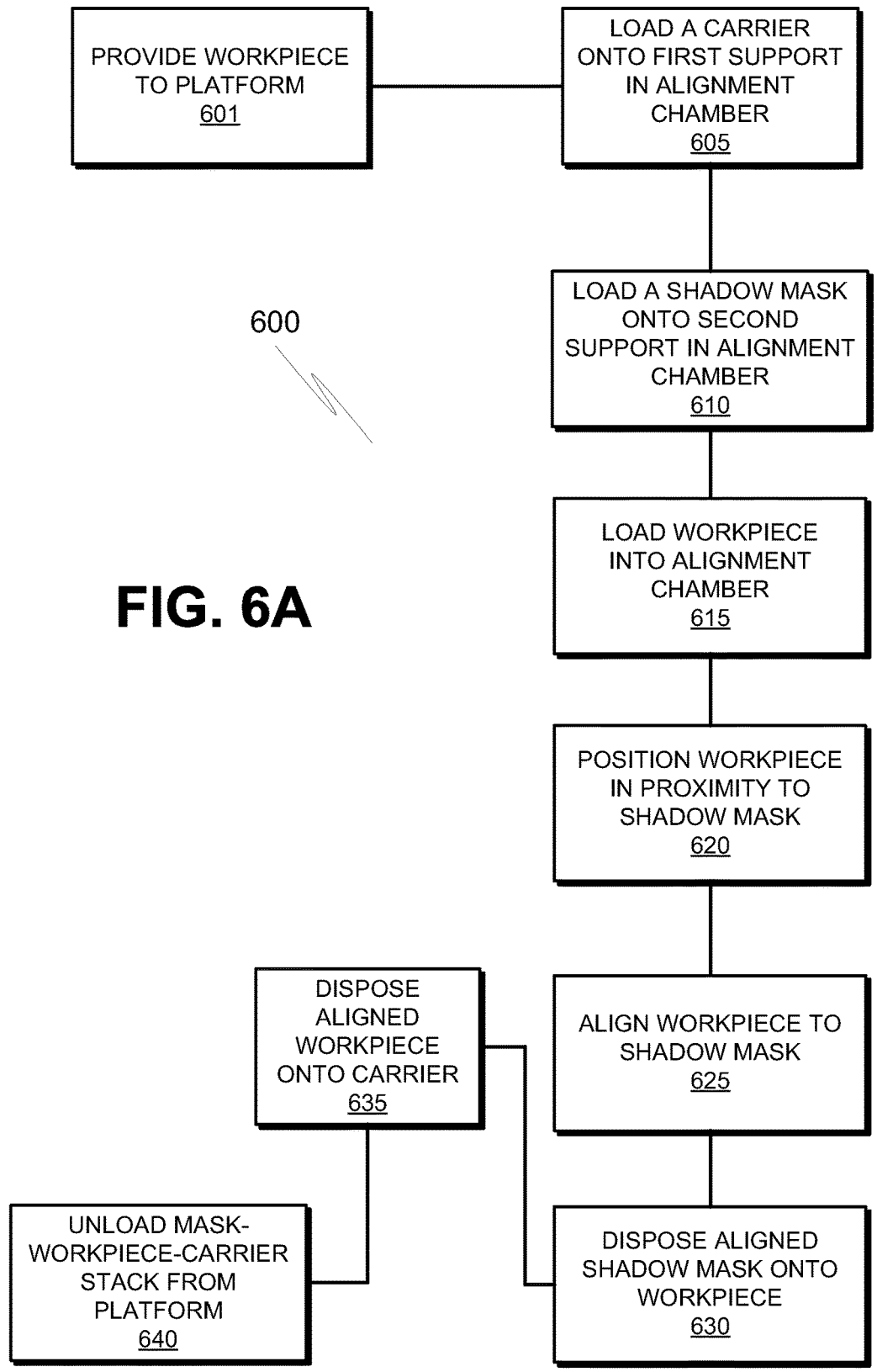
FIG. 6A illustrates a flowchart representing operations in a method for assembling a shadow mask/workpiece/magnetic handling carrier stack, in accordance with an embodiment of the present invention.

FIG. 6A illustrates a flowchart representing operations in an exemplary method 600 for assembling a shadow mask/workpiece/magnetic handling carrier stack, in accordance with an embodiment of the present invention. FIGS. 8A-8K illustrate states of the alignment chamber 530 (FIG. 5B) as particular operations of method 600 are performed.

Method 600 begins with provision of a workpiece to a platform at operation 601. In one embodiment, at operation 601, the workpiece 150 is indexed in the input port 502 of system 501. Next, at operation 605, a carrier is loaded onto a first support in an alignment chamber of the platform. In one embodiment, at operation 605 the magnetic handling carrier 101 is loaded onto the pedestal 536 (FIG. 8A). For example, the magnetic handling carrier 101 may be selected from the carrier storage module 520 (FIG. 5A), passed through the robotic handling module 505 with robotic handler 890 (FIG. 5A), and placed onto the inner lift 537 (FIGS. 8B and 8C). The inner lift 537 is then lowered to dispose the magnetic handling carrier 101 on the pedestal 536 (FIG. 8D). In an semi-automated embodiment, a human operator may provide the magnetic handling carrier 101 on inner lift 537 upon which the inner lift 537 may be automatically or manually lowered to disposed the magnetic handling carrier 101 on the pedestal 536. With the magnetic handling carrier 101 disposed on the pedestal 536 an electromagnetic, vacuum clamping force, or the like may be applied to hold the magnetic handling carrier 101 in place on the pedestal 536.

Returning to FIG. 6A, method 600 proceeds to operation 610 where a shadow mask is loaded onto a second support in the alignment chamber. In the exemplary fully automated embodiment, at operation 610 the shadow mask 160 is loaded onto the head 531 (FIG. 8D). For example, the shadow mask 160 may be selected from the shadow mask storage module 510 by the robotic handler 890, passed through the robotic handling module 505 (FIG. 5A), and placed onto the holder 535 (FIG. 8E). In a semi-automated embodiment, a human operator may provide the shadow mask 160 on holder 535. With the shadow mask 160 disposed on the head 531, an electromagnetic or vacuum clamping force, or the like, may be applied to hold the shadow mask 160 in place on the head 531.

Referring back to FIG. 6A, the method 600 proceeds to operation 615 where a workpiece is loaded into the alignment chamber 530. In the exemplary fully automated embodiment, at operation 615 the workpiece 150 is loaded from the input port 502 (FIG. 5A) into the alignment chamber 530 by the robotic handler 890 (FIG. 8F). The workpiece 150 is placed onto the outer lift 538 (FIG. 8G). With each component of the shadow mask-workpiece-magnetic handling carrier stack present within the alignment chamber 530, the workpiece 150 is either first coupled to the shadow mask 160 or to the handling carrier 101. In one embodiment where a the carrier 101 includes embedded permanent magnets, the workpiece 150 is first aligned and coupled to the shadow mask 160 so that such alignment may be performed in absence of any magnetic coupling between the shadow mask 160 and the carrier 101. In an alternative embodiment however (e.g., where the carrier 101 employs an electromagnet), workpiece 150 is first aligned and coupled to the carrier 101.

As further depicted in FIG. 6A, the workpiece is positioned into proximity to the shadow mask at operation 620 to facilitate subsequent alignment of the two. In the exemplary embodiment depicted in FIG. 8H, at least one of the head 531 and the outer lift 538 is moved relative to the other to be closer together than they were during loading of the workpiece 150. In a specific embodiment employing a CCD-based optical pattern recognition system 533, the head 531 and/or the outer lift 538 is moved to position each of the shadow mask 160 (disposed on the head 531) and workpiece 150 (disposed on the outer lift 538) within a depth of field of the CCD-based optical pattern recognition system 533 while there remains a sufficiently large separation between the shadow mask 160 and magnetic handling carrier 101 (disposed on the pedestal 536) that the shadow mask 160 is not magnetically coupled to the magnetic handling carrier 101. In particular embodiments, a neutralizing magnetic field may be applied by pedestal 536 or head 531 to reduce the effective magnetic field force between the shadow mask 160 and carrier 101.

With the head 531 and outer lift 538 in position, the method 600 proceeds to operation 625 where the workpiece is aligned to the shadow mask via controlled movement of one or more of the head 531 and pedestal 536. In the exemplary embodiment, the patterned features 161 of the shadow mask 160 are aligned to features (not shown) previously patterned in the workpiece 150 using an automated optical alignment algorithm executed by a controller based on input from the CCDs (e.g., mounted in head 531).

Upon reaching a threshold tolerance of alignment error between the position of the head 531 relative to the pedestal 536, the aligned shadow mask is disposed onto the workpiece at operation 630. For either the automated or semi-automated embodiments, once the workpiece 150 is aligned to the shadow mask 160, a perimeter holding force may be applied by the outer lift 538 to hold the workpiece 150 in place against the shadow mask 160 (as held by the holder 535) until a shadow mask-workpiece-magnetic handling carrier stack is assembled. In the exemplary embodiment, one or more of the head 531, pedestal 536, or inner lift 537 are move toward the other to bring a bottom surface of the workpiece 150 into contact with a top surface of the carrier 101 (disposed on the pedestal 536) at which point magnetic coupling between the magnetic handling carrier 101 and the shadow mask 160 affixes the shadow mask 160 to the workpiece 150 in an aligned manner to form the shadow mask/workpiece/magnetic handling carrier stack 100. For example, in one embodiment, with the shadow mask 160 aligned to the workpiece 150 while the workpiece is supported by the outer lift 538, the inner lift 537 is raised at operation 635 to dispose the aligned workpiece 150 onto the carrier 101 (FIG. 8J) and the outer lift 538 is then lowered to place the assembled magnetic handling carrier stack onto the robotic handler 890. In a semi-automated embodiment, a human operator may provide the workpiece 150 on the magnetic handling carrier 101.

The method 600 then completes at operation 699 with the assembled shadow mask/workpiece/magnetic handling carrier stack 100 being passed from the alignment chamber 530 (e.g., as positioned by inner lift 537) to port 502/503 to enable a same or separate system/platform to perform a subsequent processing (e.g., film deposition) on the assembled stack.

In a further embodiment, the system 501 may further perform disassembly of the shadow mask/workpiece/magnetic handling carrier stack after a subsequent processing (e.g., film deposition) is performed on the assembled stack. In one embodiment, alignment chamber 530 is used for disassembly operations while in another embodiment, a chamber separate from the alignment chamber 530 is utilized to disassemble a shadow mask/workpiece/magnetic handling carrier stack. In one such embodiment, a disassembly module lacking an alignment system such as the CCD-based optical pattern recognition system 533 and having simplified (e.g., less than 6-D) movement, but otherwise including all the components depicted in FIG. 5B is utilized to disassemble a shadow mask/workpiece/magnetic handling carrier stack.

Figure 9A:
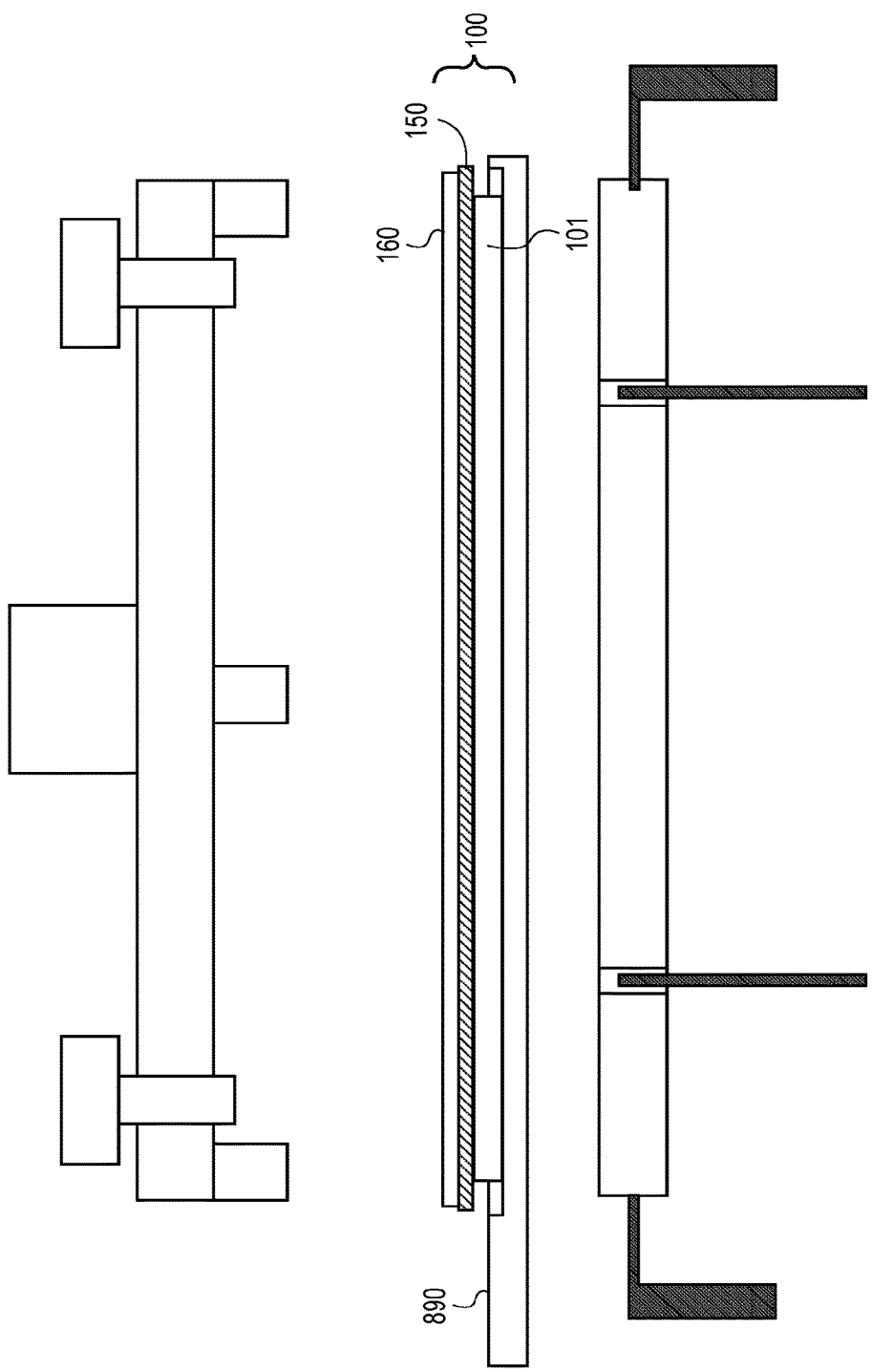
Figure 9E:
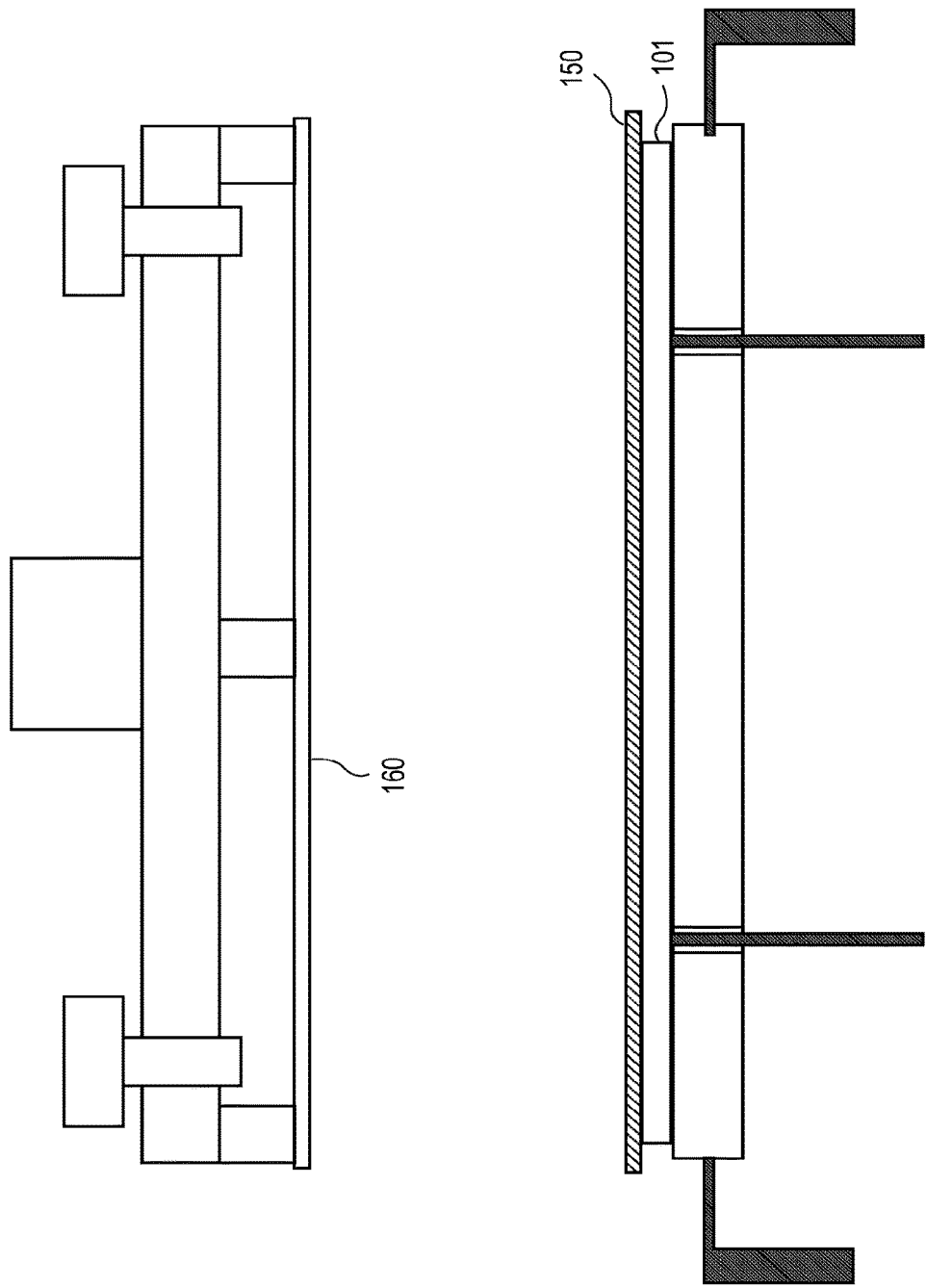

FIG. 6B depicts an exemplary disassembly method 650, beginning with providing a shadow mask/workpiece/magnetic handling carrier stack to a platform, such as system 501. FIGS. 9A-9G illustrate states of the alignment chamber 530 (FIG. 5B) as operations of method 650 are performed. For example, the shadow mask/workpiece/magnetic handling carrier stack 100 may be provided at port 502/503 (FIG. 5A). At operation 655, the assembled stack 100 is loaded by robotic handler 890 into the disassembly chamber or module (e.g., alignment chamber 530 as shown in FIGS. 9A-9C). The workpiece 150 is either first decoupled from the shadow mask 160 or from the handling carrier 101.

In one embodiment, at operation 660, the workpiece 150 is first lifted off the carrier (e.g., with outer lift 538). For example, in one embodiment where the carrier 101 includes embedded permanent magnets, the workpiece 150 is first decoupled from the carrier 101 by raising the outer lift 538 to lift the workpiece 150 to overcome the magnetic clamping force with the lifting force and a force applied by the pedestal 336 which clamps the carrier 101 to the pedestal 536.

In another embodiment, the workpiece 150 is first decoupled at operation 675 from the shadow mask 160 via a perimeter holding force applied by the outer lift 538 lowering the workpiece 150 away from the shadow mask 160 while the shadow mask 160 is clamped to the head 531 by the holder 535. Alternatively, as depicted in FIG. 9D, a neutralizing magnetic field may be applied via the pedestal 536 to disengage the magnetic coupling of the shadow mask 160 from the magnetic handling carrier 101, or an electromagnet within the carrier 101 may be powered down, while the shadow mask 160 is clamped by the holder 353.

Figure 9F:
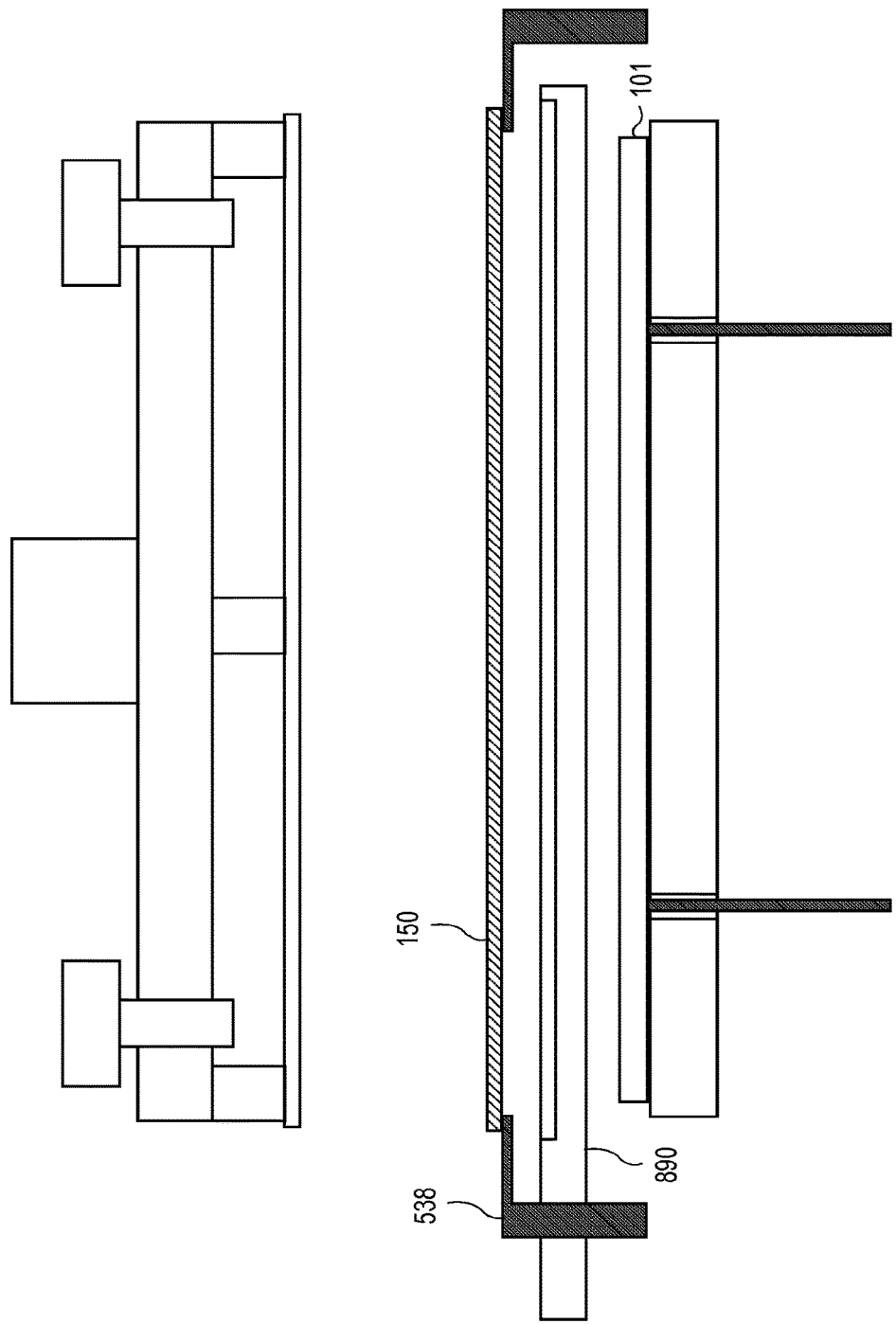

With the shadow mask 160 and carrier 101 magnetically decoupled, the shadow mask is picked up off the workpiece 150. For example, referring to FIGS. 9D-9E, head 531, outer lift 538 or pedestal 536 is moved toward the other to allow holder 535 to couple to the shadow mask 160. With the shadow mask removed, a robotic handler 890 or a human operator may remove the workpiece 150 from the disassembly chamber at operation 680 (FIG. 9F). In the exemplary fully automated embodiment, robotic handling module 505 transfers the workpiece 150 from the alignment chamber 530 to port 502/503 where it may be unloaded from system 501 at operation 699 for subsequent maskless processing.

Figure 9G:
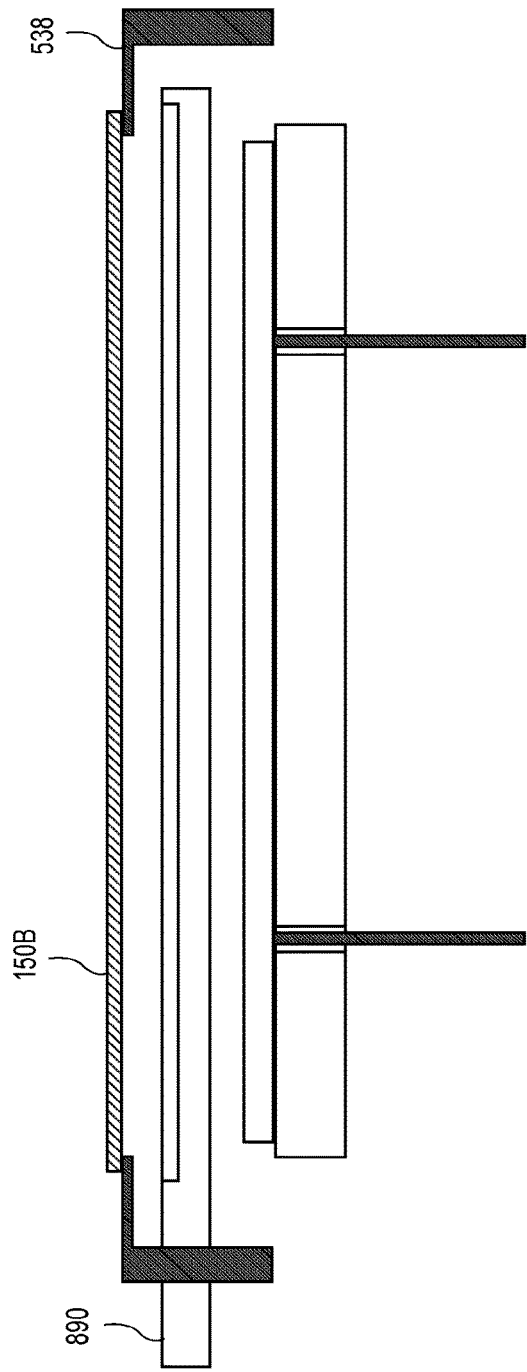
FIG. 9G illustrates a cross-sectional view of an operation in the method shown in FIG. 6C for integrated assembly and disassembly of a first shadow mask/workpiece/magnetic handling carrier stack with assembly of a second shadow mask/workpiece/magnetic handling carrier stack.

At operation 690, a robotic handler or operator may further remove the shadow mask 160 from the disassembly chamber or allow the shadow mask 160 to remain affixed to the head 531 and be subsequently aligned to a new workpiece 150B, as depicted in FIG. 9G and discussed further elsewhere herein. Similarly, at operation 695, a robotic handler or operator may also remove the magnetic handling carrier 101 from the disassembly chamber or allow the magnetic handling carrier 101 to remain affixed to the pedestal 536 to receive a new workpiece, as discussed further elsewhere herein.

In a particular embodiment where the alignment chamber 530 is utilized for both assembly and disassembly of shadow mask/workpiece/magnetic handling carrier stacks, disassembly of a first stack is performed concurrently with assembly of a second stack to minimize transfer of carriers and shadow masks. Such an embodiment may be advantageous when a workflow has workpieces staged at successive operations and shadow masks from completed workpieces may be moved directly to workpieces yet to be processed.

Figure 6C:
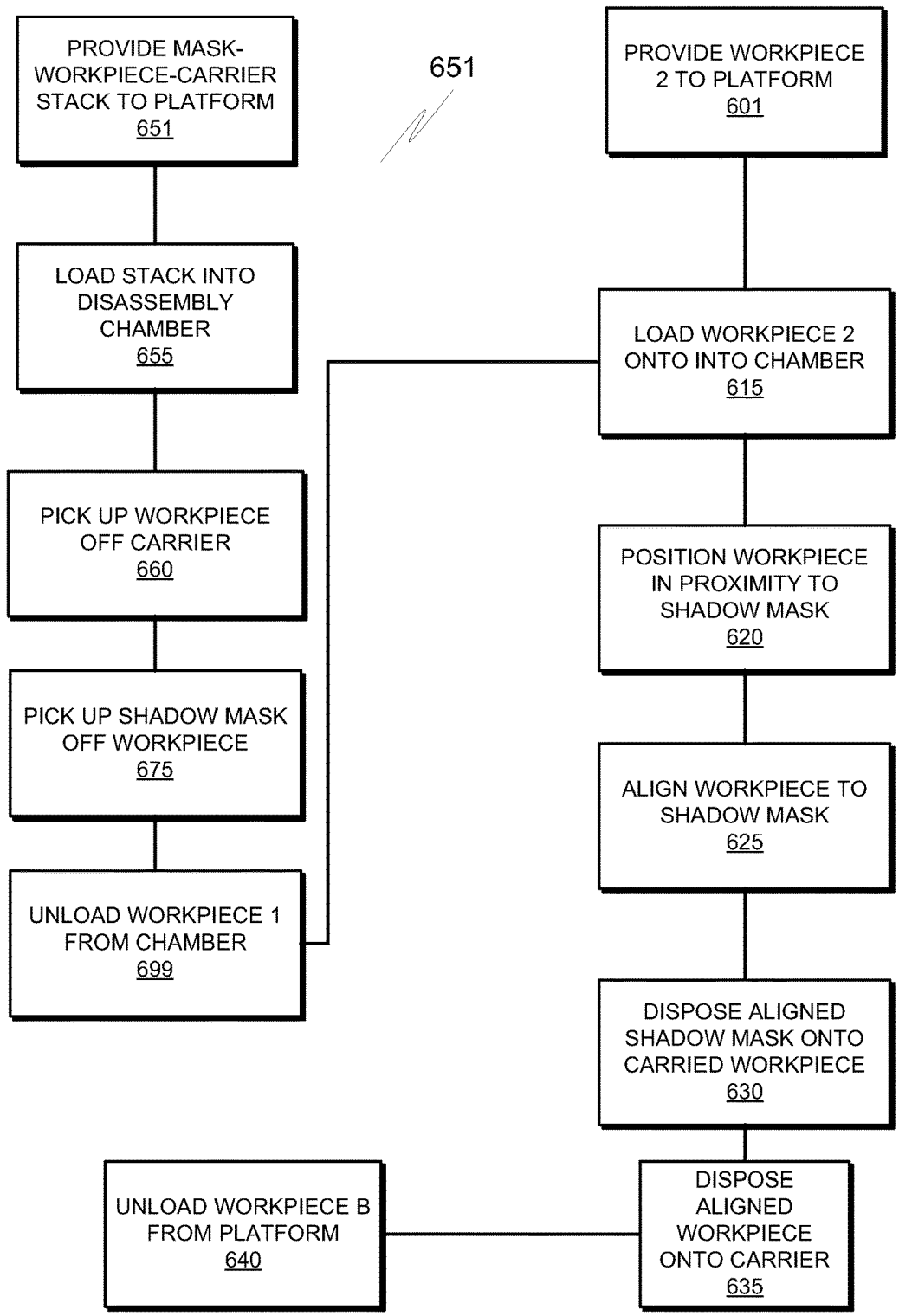
FIG. 6C illustrates a flowchart representing operations in a method for integrating disassembly of a first shadow mask/workpiece/magnetic handling carrier stack with assembly of a second shadow mask/workpiece/magnetic handling carrier stack, in accordance with an embodiment of the present invention.

FIG. 6C illustrates a flowchart representing operations in an exemplary method 651 for integrating disassembly of a first shadow mask/workpiece/magnetic handling carrier stack with assembly of a second shadow mask/workpiece/magnetic handling carrier stack, in accordance with an embodiment. Generally, selected operations depicted in FIGS. 6A and 6B are sequenced to effect concurrent assembly and disassembly. More specifically, operations 651 and 601 are is performed to provide both a shadow mask/workpiece/magnetic handling carrier stack including a first workpiece as well as a second (unmounted) workpiece to a platform, such as system 501. Method 651 then proceeds to perform operations 655, 660, 675, 690 and 699 substantially as described elsewhere herein. Subsequently, operation 615 is performed to load the second workpiece 150B in the assembly chamber (e.g., as shown in FIG. 9G). Operations 620, 625, 630 and 640 are then performed substantially as described elsewhere herein to complete method 651.

Figure 7:
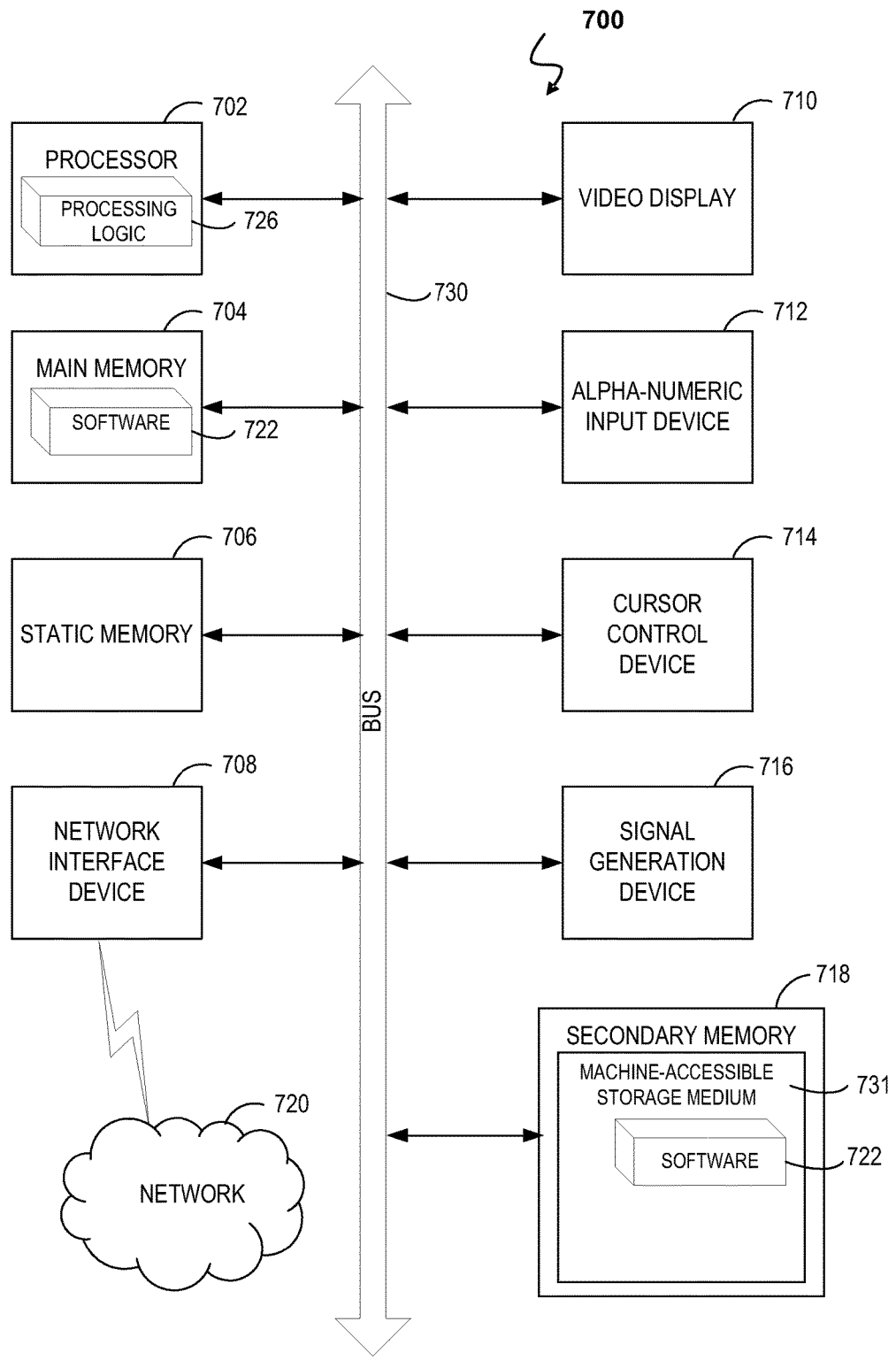
FIG. 7 depicts a block diagram of a computer system which may be employed to control the automated shadow mask assembly/disassembly system depicted in FIG. 5 to perform one or more of the methods of FIGS. 6A, 6B, and 6C.
Figure 8J:
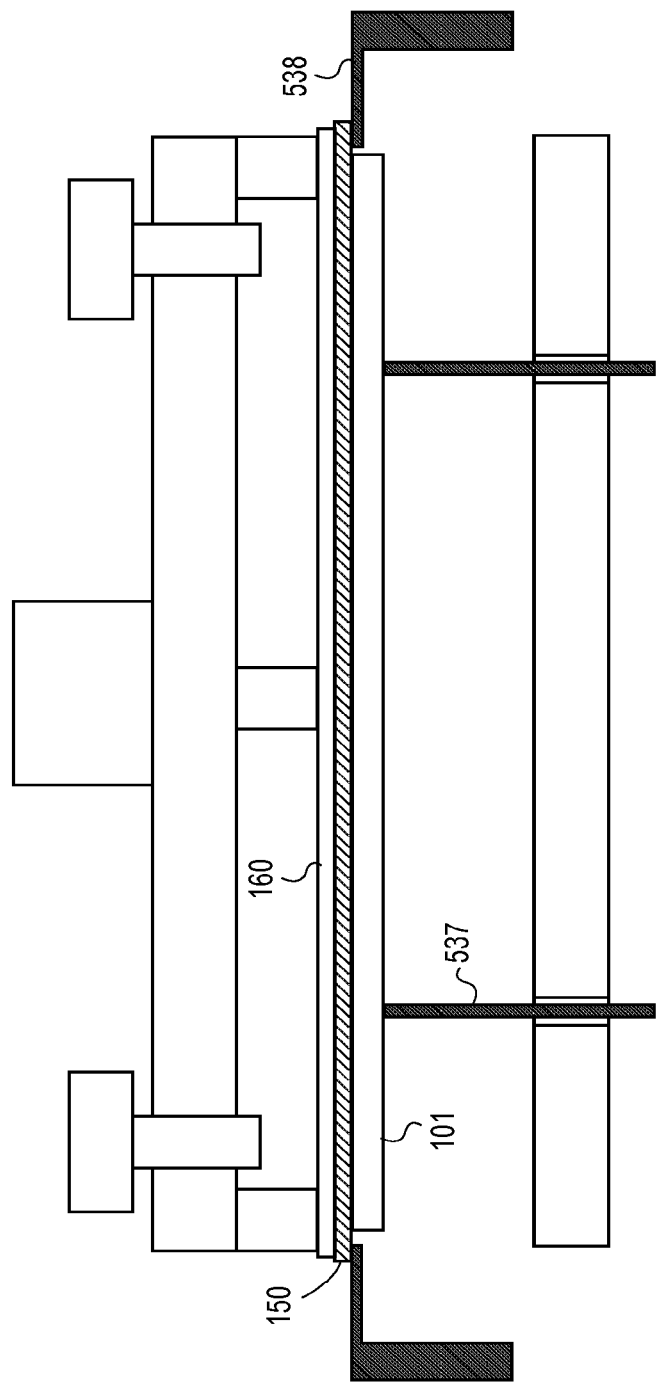
Figure 8K:
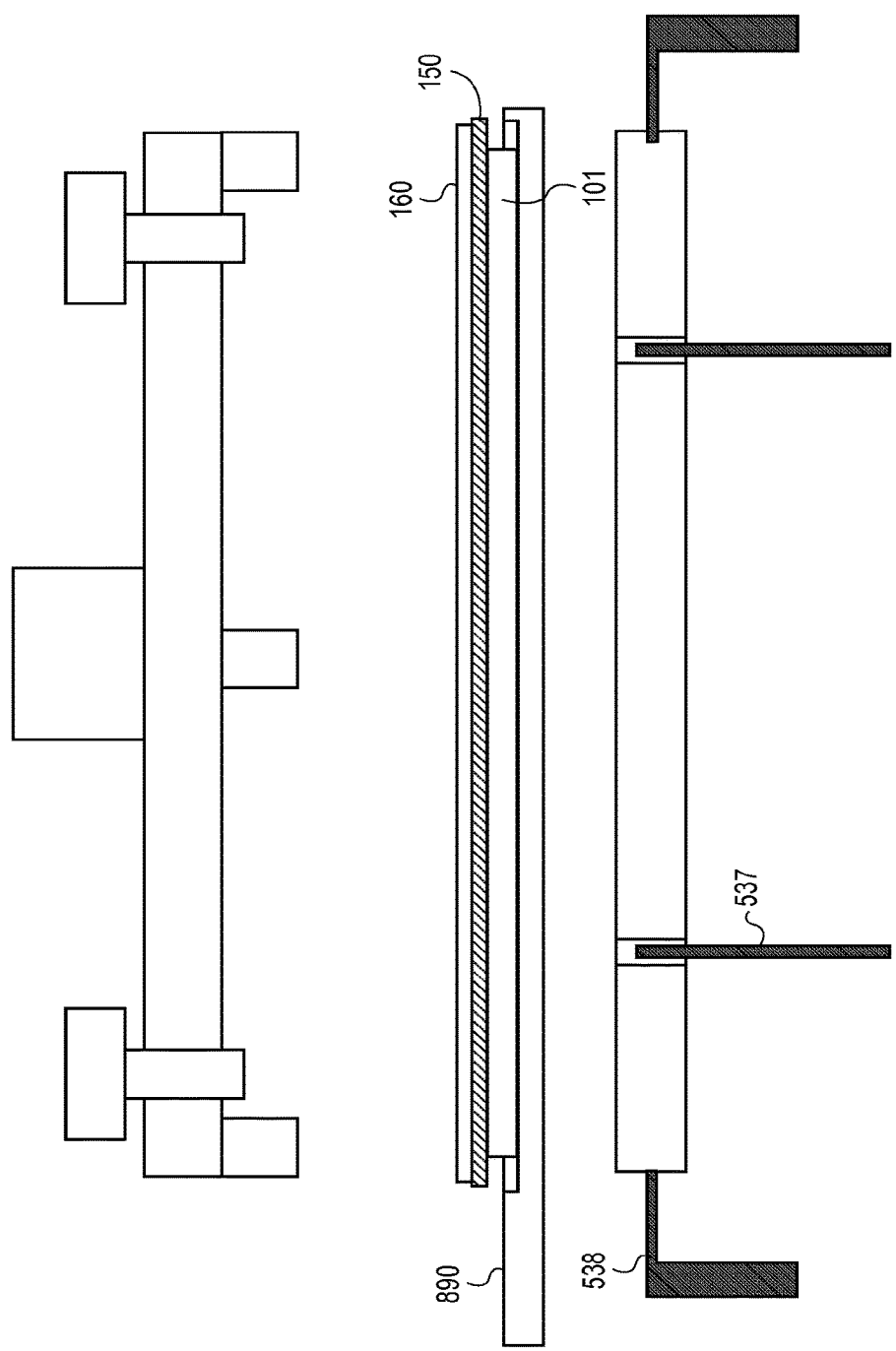

FIG. 7 depicts a block diagram of a computer system 700 which may be employed to control the automated shadow mask assembly/disassembly system 501 depicted in FIG. 5A and/or alignment chamber 530 depicted in FIG. 5B, to perform one or more of the methods of FIGS. 6A, 6B, and 6C.

The exemplary computer system 700 may be utilized to control one or more of the operations, process chambers or processing platforms described herein. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

The processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 702 may also be one or more special-purpose processing devices such as an application specific integrated circuit (ASIC), a field programmable gate array (FPGA), a digital signal processor (DSP), network processor, or the like. The processor 702 is configured to execute the processing logic 726 for performing the process operations discussed elsewhere herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methods or functions described herein. The software 722 may also reside, completely or at least partially, within the main memory 704 and/or within the processor 702 during execution thereof by the computer system 700, the main memory 704 and the processor 702 also constituting computer-readable storage media. The software 722 may further be transmitted or received over a network 720 via the network interface device 708.

The computer-readable storage medium 731 may further be used to store a set of instructions for execution by a processing system and that cause the system to perform any one or more of the embodiments of the present invention. Embodiments of the present invention may further be provided as a computer program product, or software, that may include a computer-readable storage medium having stored thereon instructions, which may be used to program a computer system (or other electronic devices) to perform a process according to the present invention. A computer-readable storage medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, and flash memory devices, etc.).

Thus, a magnetic handling carrier and methods of assembling and disassembling manufacturing assemblies such as a shadow mask/workpiece/magnetic handling carrier stack has been disclosed. Although embodiments of the present invention have been described in language specific to structural features or particular methodological acts, it is to be understood that the invention conveyed herein is not necessarily limited to the illustrative features and embodiments described.

What is claimed is:

1. A method of handling a shadow mask to cover a top of a workpiece for exposure to a processing condition, the method comprising:
    disposing a handling carrier on a first support;
    disposing a shadow mask on a second support;
    aligning, with a computer-controlled multi-axis stage, a first pattern feature of the shadow mask to a second pattern feature of a workpiece by moving the first support a first distance relative to the second support based on a computerized pattern recognition system; and
    coupling the aligned shadow mask with the handling carrier by moving the first support a second distance relative to the second support to bring a bottom surface of the aligned shadow mask into a magnetic field of the handling carrier, wherein the magnetic field of the handling carrier comprises a plurality of defined magnetic regions across a surface of the handling carrier over which the shadow mask is secured, wherein the plurality of defined magnetic region have different field strengths.

2. The method of claim 1, further comprising:
    disposing the workpiece on the handling carrier prior to aligning the first and second pattern features.

3. The method of claim 2, further comprising:
    suspending the shadow mask while disposed on the first support over the workpiece while aligning the first and second pattern features.

4. The method of claim 1, further comprising:
    transferring the handling carrier from a first module storing a plurality of handling carriers to the first support with a robotic handler; and
    transferring the shadow mask from a second module storing a plurality of shadow masks to the first support with the robotic handler.

5. The method of claim 1, further comprising:
    removing, neutralizing, or overcoming the magnetic field of the handling carrier to physically separate the shadow mask from the workpiece.

6. The method of claim 5, further comprising:
    disposing a second workpiece between the handling carrier and the shadow mask for assembly.

* * * * *